(12) United States Patent
Xu et al.

(10) Patent No.: US 7,573,264 B2
(45) Date of Patent: Aug. 11, 2009

(54) ATOMIC MAGNETIC GRADIOMETER FOR ROOM TEMPERATURE HIGH SENSITIVITY MAGNETIC FIELD DETECTION

(75) Inventors: Shoujun Xu, Berkeley, CA (US); Thomas L. Lowery, Belmont, MA (US); Dmitry Budker, El Cerrito, CA (US); Valeriy V. Yashchuk, Richmond, CA (US); David E. Wemmer, Berkeley, CA (US); Alexander Pines, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 127 days.

(21) Appl. No.: 11/563,537

(22) Filed: Nov. 27, 2006

(65) Prior Publication Data

US 2007/0205767 A1 Sep. 6, 2007

Related U.S. Application Data

(60) Provisional application No. 60/740,474, filed on Nov. 28, 2005.

(51) Int. Cl.
*G01V 3/00* (2006.01)
(52) U.S. Cl. .................. 324/304; 324/301; 324/307; 324/318
(58) Field of Classification Search ............... 324/304, 324/301, 318, 307
See application file for complete search history.

(56) References Cited

U.S. PATENT DOCUMENTS

| | | | |
|---|---|---|---|
| 6,472,869 B1 * | 10/2002 | Upschulte et al. | 324/304 |
| 7,038,450 B2 * | 5/2006 | Romalis et al. | 324/304 |
| 7,053,610 B2 | 5/2006 | Clarke et al. | |
| 7,061,237 B2 | 6/2006 | Pines et al. | |
| 7,145,333 B2 * | 12/2006 | Romalis et al. | 324/304 |

OTHER PUBLICATIONS

Affolderbach et al., "An All-Optical, High-Sensitivity Magnetic Gradiometer", Applied Physics B: Lasers and Optics, vol. 75, p. 605-612, (2002).

Alexandrov et al., "Light-Induced Desorption of Alkali-Metal Atoms From Paraffin Coating", Physical Review A, vol. 66, p. 042903, (2002).

Allred et al., "High-Sensitivity Atomic Magnetometer Unaffected by Spin-Exchange Relaxation", Physical Review Letters, vol 89 (No. 13), p. 130801, (Sep. 23, 2002).

(Continued)

*Primary Examiner*—Brij B. Shrivastav
*Assistant Examiner*—Megann E Vaughn
(74) *Attorney, Agent, or Firm*—Knobbe, Martens, Olson & Bear LLP

(57) ABSTRACT

A laser-based atomic magnetometer (LBAM) apparatus measures magnetic fields, comprising: a plurality of polarization detector cells to detect magnetic fields; a laser source optically coupled to the polarization detector cells; and a signal detector that measures the laser source after being coupled to the polarization detector cells, which may be alkali cells. A single polarization cell may be used for nuclear magnetic resonance (NMR) by prepolarizing the nuclear spins of an analyte, encoding spectroscopic and/or spatial information, and detecting NMR signals from the analyte with a laser-based atomic magnetometer to form NMR spectra and/or magnetic resonance images (MRI). There is no need of a magnetic field or cryogenics in the detection step, as it is detected through the LBAM.

32 Claims, 18 Drawing Sheets

OTHER PUBLICATIONS

Balabas et al., "Magnetometry with Millimeter-Scale Antirelaxation-Coated . . . ", Journal of the Optical Society of America B, vol. 23 (No. 6), p. 1001-1006, (Jun. 2006).

Bermejo et al., "Understanding the Anomalous Thermal Properties of Para-hydrogen", Highlights of ISIS Science, p. 54-55, (1999).

Budker et al., "Nonlinear Magneto-optic Effects with Ultranarrow Widths", Physical Review Letters, vol. 81 (No. 26), p. 5788-5791, (Dec. 28, 1998).

Budker et al., "Sensitive Magnetometry Based on Nonlinear Magneto-optical Rotation", Physical Review A, vol. 62, p. 043403, (Sep. 11, 2000).

Budker et al., "Nonlinear Magneto-optical Rotation with Frequency-modulated Light", Physical Review A, vol. 65, p. 055403, (May 2, 2002).

Budker et al., "Nonlinear Laser Spectroscopy and Magneto-Optics", American Journal of Physics, vol. 67 (No. 7), p. 584-592, (Jul. 1999).

Budker et al., "Nonlinear Magneto-optics and Reduced Group Velocity of Light in Atomic Vapor with . . . ", Physical Review Letters, vol. 83 (No. 9), p. 1767-1770, (Aug. 1999).

Budker, "A New Spin on Magnetometry", Nature, vol. 422, p. 574-575, (Apr. 10, 2003).

Cohen-Tannoudji et al., "Detection of the Static Magnetic Field Produced by the Oriented Nuclei of . . . ", Physical Review Letters, vol. 22 (No. 15), p. 758-760, (Apr. 14, 1969).

Connolly et al., "Cobalt Nanoparticles Formed in Polysiloxane Copolymer Micelles: Effect of . . . ", Journal of Physics D: Applied Physics, vol. 37, p. 2475-2482, (2004).

Corwin et al., "Frequency-stabilized Diode Laser with the Zeeman Shift in an Atomic Vapor", Applied Optics, vol. 37 (No. 15), p. 3295-3298, (May 20, 1998).

Fannin et al., "Dynamic Properties of a System of Cobalt Nanoparticles", European Physical Journal: Applied Physics, p. 3-9, (2002).

Gawlik et al., "Nonlinear Magneto-optical Rotation with Amplitude Modulated Light", Applied Physics Letters, vol. 88, p. 131108, (2006).

Goodson et al., "Advances in Magnetic Resonance: Nuclear Magnetic Resonance of Laser-Polarized Noble Gases in . . . ", Journal of Magnetic Resonance, vol. 155, p. 157-216, (2002).

Granwehr et al., "Time-of-Flight Flow Imaging Using NMR Remote Detection", Physical Review Letters, vol. 95, p. 075503, (Aug. 12, 2005).

Gupta et al., "Synthesis and Surface Engineering of Iron Oxide Nanoparticles for Biomedical Applications", Biomaterials, vol. 26, p. 3995-4021, (2005).

Kominis et al., "A Subfemtotesla Multichannel Atomic Magnetometer", Nature, vol. 422, p. 596-599, (Apr. 10, 2003).

Krause et al., "Detection of Magnetic Contaminations in Industrial Products Using HTS SQUIDs", IEEE Trans. on Applied Superconductivity, vol. 15(No. 2), p. 729-732, (Jun. 2005).

Lee et al., "SQUID-Detected MRI at 132 µT with T1-Weighted Contrast Established at 1-µT-300mT", Magnetic Resonance in Medicine, vol. 53, p. 9-14, (2005).

McDermott et al., "Liquid-State NMR and Scalar Couplings in Microtesla Magnetic Fields", Science, vol. 295, p. 2247-2249, (Mar. 22, 2002).

Montemayor et al., "Preparation and Characterization of Cobalt Ferrite by the Polymerized Complex Method", Materials Letters, vol. 59, p. 1056-1060, (2005).

Mouléet al., "Amplification of Xenon NMR and MRI by Remote Detection", Proceedings of the National Academy of Sciences, vol. 100 (No. 16), p. 9122-9127, (Aug. 5, 2003).

Nam et al., "Nanoparticle-Based Bio-Bar Codes for the Ultrasensitive Detection of Proteins", Science, vol. 301, p. 1884-1886, (2003).

Newbury et al., "Polarization-Dependent Frequency Shifts from Rb-3He Collisions", Physical Review A, vol 48 (No. 1), p. 558-568, (Jul. 1993).

Odenbach, "Magnetic Fluids-suspensions of Magnetic Dipoles and their Magnetic Control", Journal of Physics: Condensed Matter, vol. 15, p. S1497-S1508, (2003).

Pankhurst et al., "Applications of Magnetic Nanoparticles in Biomedicine", Journal of Physics D: Applied Physics, vol. 36, p. R167-R181, (2003).

Pekas et al., "Giant Magnetoresistance Monitoring of Magnetic Picodroplets in an Integrated . . . ", Applied Physics Letters, vol. 85 (No. 20), p. 4783-4785, (Nov. 15, 2004).

Savukov et al., "NMR Detection with an Atomic Magnetometer", Physical Review Letters, vol. 94, p. 123001, (Apr. 1, 2005).

Schwindt et al., "Chip-scale Atomic Magnetometer", Applied Physics Letters, vol. 85 (No. 26), p. 6409-6411, (Dec. 27, 2004).

Schwindt et al., "Self-oscillating Rubidium Magnetometer Using Nonlinear Magneto-optical Rotation", Review of Scientific Instruments, vol. 76, p. 126103, (Dec. 14, 2005).

Seeley et al., "Remotely Detected High-Field MRI of Porous Samples", Journal of Magnetic Resonance, vol. 167, p. 282-290, (2004).

Tsukamoto et al., "Development of Multisample Biological Immunoassay System Using . . . ", IEEE Transactions on Applied Superconductivity, vol. 15 (No. 2), p. 656-659, (Jun. 2005).

Turvey et al., "Noninvasive Imaging of Pancreatic Inflammation and its Reversal in . . . ", Journal of Clinical Investigation, vol. 115 (No. 9), p. 2454-2461, (Sep. 2005).

Wong-Foy et al., "Laser-Polarized 129Xe NMR and MRI at Ultralow Magnetic Fields", Journal of Magnetic Resonance, vol. 157, p. 235-241, (2002).

Wood et al., "Submicron Giant Magnetoresistive Sensors for Biological Applications", Sensors and Actuators A: Physical, vol. 120, p. 1-6, (2005).

Xu et al., "Magnetic Resonance Imaging with an Optical Atomic Magnetometer", Proceedings of the National Acad. of Sciences, vol. 103(No. 34), p. 12668-12671, (Aug. 22, 2006).

Xu et al., "Construction and Applications of an Atomic Magnetic Gradiometer Based on Nonlinear Magneto-optical . . . ", Review of Scientific Instruments, vol. 77, p. 083106, (2006).

Yashchuk et al., "Hyperpolarized Xenon Nuclear Spins Detected by optical Atomic Magnetometry", Physical Review Letters, vol. 93 (No. 16), p. 160801, (Oct. 15, 2004).

Yashchuk et al., "Laser Frequency Stabilization Using Linear Magneto-optics", Review of Scientific Instruments, vol. 71 (No. 2), p. 341-346, (Feb. 2000).

* cited by examiner

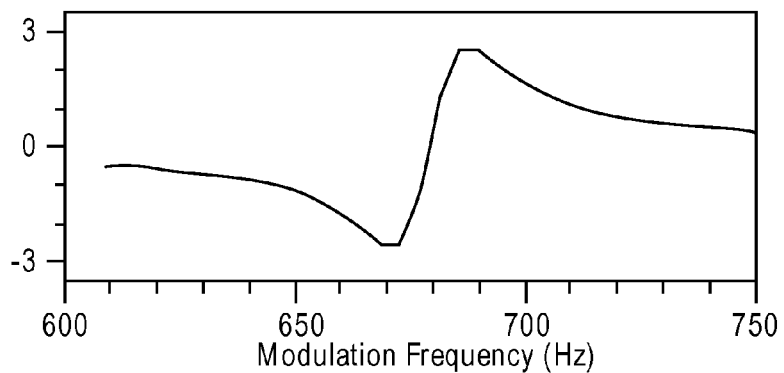
FIG. 5A1
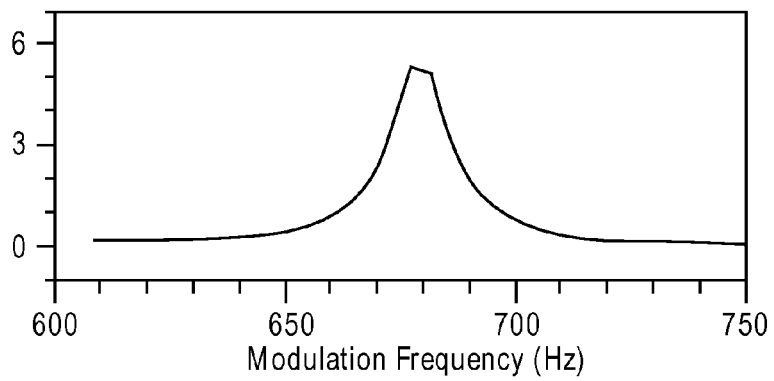
FIG. 5A2
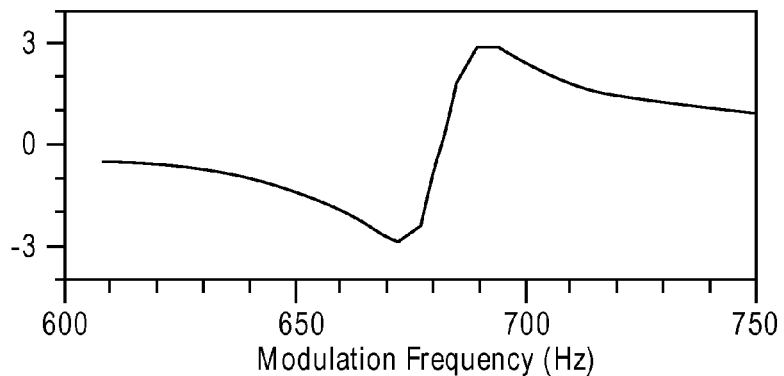
FIG. 5B1
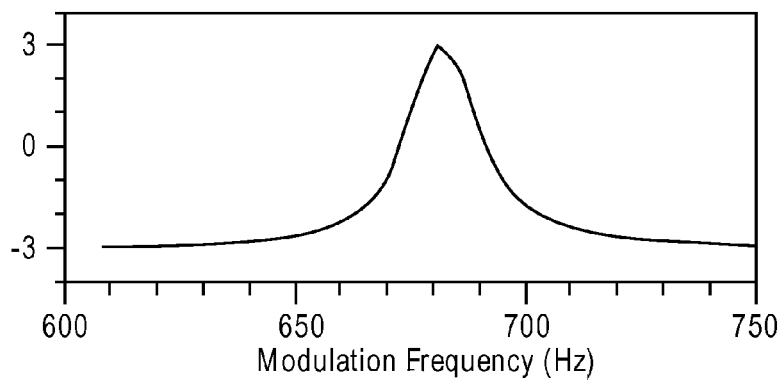
FIG. 5B2

FIG. 11
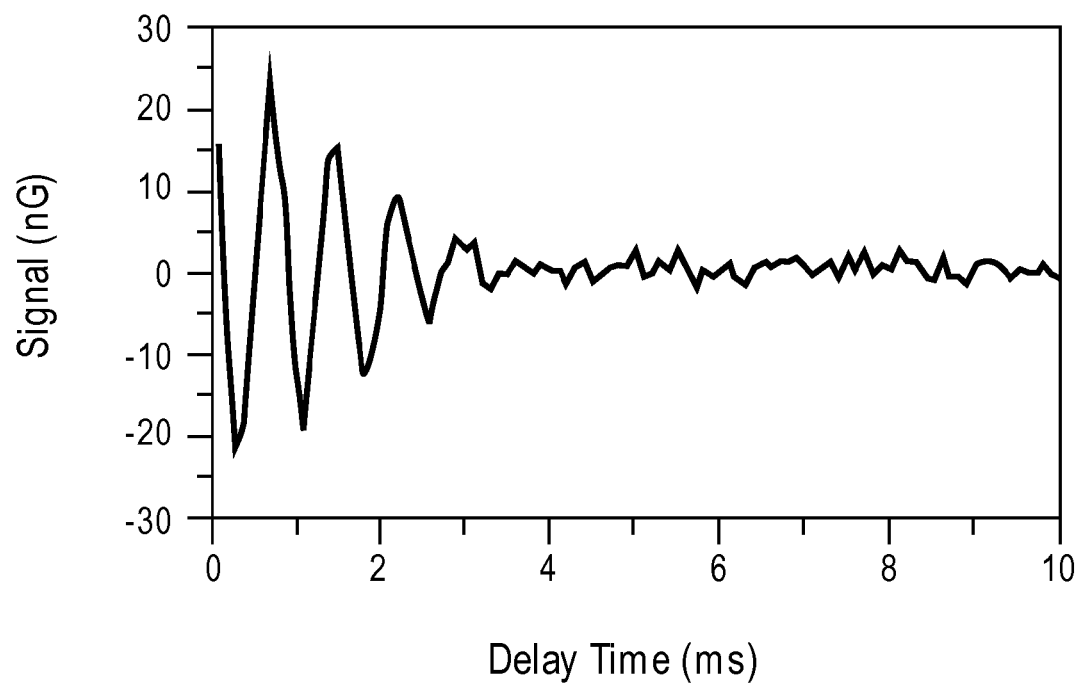
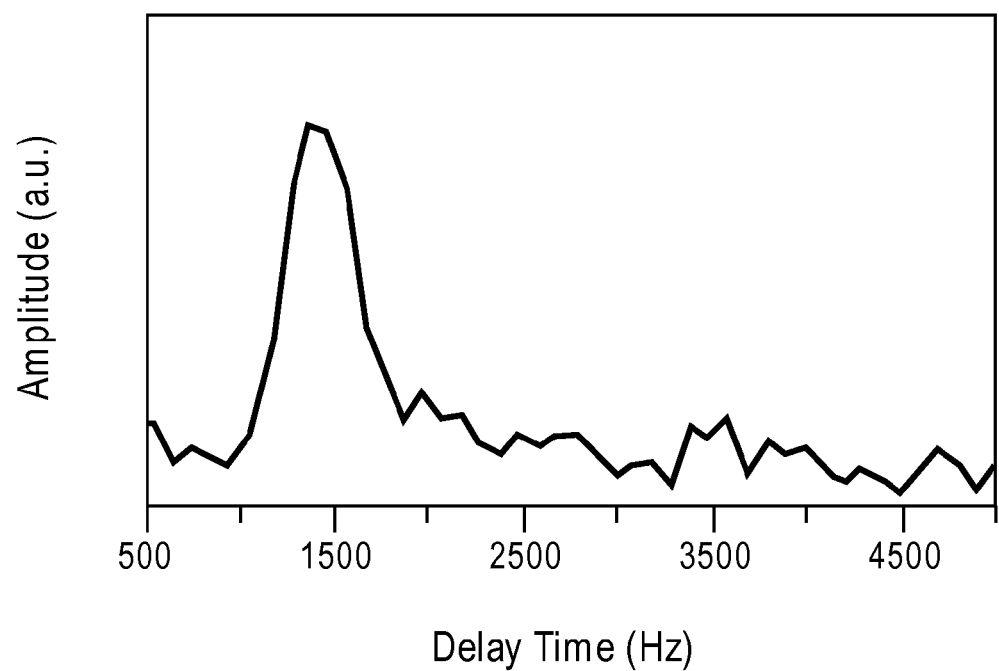

ATOMIC MAGNETIC GRADIOMETER FOR ROOM TEMPERATURE HIGH SENSITIVITY MAGNETIC FIELD DETECTION

CROSS REFERENCE TO RELATED APPLICATIONS

This US patent application claims benefit of priority to U.S. provisional patent application 60/740,474 filed Nov. 28, 2005.

STATEMENT REGARDING FEDERAL FUNDING

This ivention was made with U.S. Government surport under Contract Number DE-AC02-05 CH11231 between the U.S. Department of Energy and The Regents of the University of California for the management and operation of the Lawrence Berkeley National Laboratory. The U.S. Government has the right in this invention.

REFERENCE TO A COMPUTER PROGRAM

Not Applicable.

BACKGROUND OF THE INVENTION

1. Field of the Invention

The present invention generally relates to high sensitivity magnetic field detection, more specifically to high sensitivity magnetic field detection without superconducting quantum interference devices (SQUIDs), and still more specifically to room temperature NMR/MRI and direct magnetic field detection through the application of a laser based atomic magnetometer.

2. Description of the Relevant Art

High sensitivity detection of magnetic fields has previously been possible only with superconducting quantum interference devices (SQUIDs), or with Faraday detection coupled with an extremely high measurement field.

U.S. Pat. No. 7,061,237, issued Jun. 13, 2006 to Pines et al, incorporated by reference in its entirety, relates to an apparatus and method for remote NMR/MRI spectroscopy having an encoding coil with a sample chamber, a supply of signal carriers, preferably hyperpolarized xenon and a detector allowing the spatial and temporal separation of signal preparation and signal detection steps. This separation allows the physical conditions and methods of the encoding and detection steps to be optimized independently. The encoding of the carrier molecules may take place in a high or a low magnetic field and conventional NMR pulse sequences can be split between encoding and detection steps. In one embodiment, the detector is a high magnetic field NMR apparatus. In another embodiment, the detector is a superconducting quantum interference device. A further embodiment uses optical detection of Rb—Xe spin exchange. Another embodiment uses an optical magnetometer using non-linear Faraday rotation. Concentration of the signal carriers in the detector can greatly improve the signal to noise ratio. Remote detection is a hallmark of this invention.

U.S. Pat. No. 7,053,610, issued May 30, 2006 to Clarke et al., incorporated by reference in its entirety, relates to SQUID detected NMR and MRI at ultralow fields. Here, nuclear magnetic resonance (NMR) signals are detected in microtesla fields. Prepolarization in millitesla fields is followed by detection with an untuned dc superconducting quantum interference device (SQUID) magnetometer. Because the sensitivity of the SQUID is frequency independent, both signal-to-noise ratio (SNR) and spectral resolution are enhanced by detecting the NMR signal in extremely low magnetic fields, where the NMR lines become very narrow even for grossly inhomogeneous measurement fields. MRI in ultralow magnetic field is based on the NMR at ultralow fields. Gradient magnetic fields are applied, and images are constructed from the detected NMR signals.

Detractions of the Clarke et al. patent are that cryogenic temperatures are required, as well as cumbersome thermal shielding between the cryogenic SQUID and the room temperature sample or subject. A great improvement of the technology would be available if low field NMR and MRI could be obtained without the cumbersome cryogenic requirements. An even greater improvement would be if the measurement fields were irrelevant, and completely unnecessary.

BRIEF SUMMARY OF THE INVENTION

In one embodiment, this invention provides a laser-based atomic magnetometer apparatus that measures nuclear magnetic fields, comprising: a) a plurality of polarization detector cells to detect magnetic fields; b) a laser source optically coupled to the polarization detector cells; c) a signal detector that measures the laser source after being coupled to the polarization detector cells. The polarization detector cells are extremely sensitive to magnetic fields, which cause changes of the laser polarization that can be measured by the signal detector. Typically, the polarization detector cells are alkali cells, which typically operate at room temperature or above.

In most configurations, the plurality of alkali cells are two cells that measure substantially the same magnetic field. This arrangement allows for a gradiometer configuration that allows for DC common mode rejection of ambient magnetic fields. Other gradiometer arrangements may be selected from a group consisting of: a) more than two cells substantially arranged to form a higher order gradiometer; b) an array of alkali cells for substantially simultaneous detection; and c) an ambient magnetic field measuring cell in conjunction with one or more distant measurement cells. When higher order cell configurations are used, the magnetic field of the sample being measured may be determined by Gaussian interpolation, or other standard numerical interpolation techniques.

The laser-based atomic magnetometer apparatus laser source is selected from a group consisting of: continuous, continuously or intermittently pulsed. These various arrangements may be adapted for data acquisition based on the duty cycle of the laser source. The signal detector may be selected from a group consisting of: a photodiode, a pin diode, a silicon-based diode, an InGaAs diode, a germanium-based diode, and a photomultiplier.

The detection technique may be described as a laser source, a polarization detector cell, and a signal detector. These components, when used together, may comprise an extremely sensitive magnetic field measurement device. In fact, the system that results is so sensitive that it may directly detect nuclear magnetic resonance from magnetic field variations, without using a magnetic field to induce Faraday detection.

In an alternate embodiment, a method of nuclear magnetic resonance may comprise the steps of: a) prepolarizing an analyte; b) encoding the analyte in a sample; c) detecting the polarization of the analyte with the laser-based atomic magnetometer apparatus of described above; and d) forming a nuclear magnetic resonance image from a data set acquired from the detecting step. The method may also comprise passing the prepolarized analyte into the sample, or alternatively, the prepolarized analyte may already be present in the sample.

The encoding step above may encode spatial information (in one, two, or three dimensions), or alternatively encode spectroscopic information.

In another embodiment, a method for nuclear magnetic resonance (NMR) of a sample, may comprise: a) prepolarizing nuclear spins in the sample in an inhomogeneous millitesla or higher magnetic field; b) detecting nuclear magnetic resonance signals from the sample with a laser-based atomic magnetometer to form detected NMR signals. In this embodiment, the prepolarizing magnetic field may be in the range of about 1 mT to about 0.5 T. A maximum field strength is envisioned to be a practical maximum of ~2-5 T, although there is no absolute maximum limit.

The prepolarizing step described above may comprise one or more of the group consisting of: a) exposing the sample to a mT or stronger magnetic field; b) hyperpolarizing one or more of $^{129}$Xe, $^{131}$Xe, $^{3}$He, parahydrogen; c) dynamically polarizing; and d) chemical nuclear polarizing.

The detecting step described above may be performed with one or more alkali cells, or alternatively, with one or more polarization detectors.

In another embodiment, the methods described herein may be used for performing magnetoencephalography.

In all of the embodiments above, the sample is maintained substantially at room temperature or a temperature of research interest; and the alkali cells are maintained in a temperature range from room temperature to about 250° C. The room temperature of the sample is for typical convenience. When a sample is normally at temperatures other than room temperature, no particular problem is presented other than limiting heat transfer between the sample and the alkali cells if direct contact is present between them. In an extreme case where a cryogenically frozen sample is to be examined, there may need to be thermal shielding between the sample and the alkali cell for the purpose of maintaining the sample in its cryogenic state.

The method described above may further comprise performing magnetic resonance imaging (MRI) of the sample by forming an image from the detected NMR signals. Again, methods above further comprising applying encoding magnetic field gradients to the sample to encode spatial information.

The methods above may also be used to simultaneously detect multinuclear species, or to obtain scalar ("J") coupling information from the detected NMR signals.

A further embodiment may include a method of magnetic particle detection comprising: a) providing a magnetic particle; b) means for detecting the magnetic particle with a laser-based atomic magnetometer. The magnetic particle may either already be present, or may be introduced into a flow to be analyzed. The means for detecting the magnetic particle may comprise: a) providing a magnetic shield around the laser-based atomic magnetometer; b) piercing the magnetic shield to allow a flow through the laser-based atomic magnetometer in a sampling region; and c) pumping a volume that comprises the magnetic particle through the sampling region. It is understood that the laser-based atomic magnetometer has several parts, and that only the portion of the magnetometer responsive to magnetic fields need be shielded. Additionally, the pumping may be accomplished through standard engineering means, or by means of biologically extant pumps, such as human hearts. Magnetic particle detection may include traditional magnetic imaging agents already used for MRI imaging, or may include other tagging procedures, such as tagging of pharmaceuticals or other agents with a component that may be magnetically detected by laser-based atomic magnetometer. Using higher order magnetometers, one or more orders of magnetic inhomogeneity may be mapped in a sample volume, thereby reducing noise remaining after any magnetic shielding through numerical offsetting procedures.

BRIEF DESCRIPTION OF THE SEVERAL VIEWS OF THE DRAWINGS

The invention will be more fully understood by reference to the following drawings, which are for illustrative purposes only:

FIG. 5 shows four plots of synchronous nonlinear magneto-optical rotation as a function of the laser modulation frequency. A1 and A2 are the in-phase and out-of-phase outputs from magnetometer A, respectively. B1 and B2 are the respective in-phase and out-of-phase outputs from magnetometer B. Laser power is ~8 µW for each magnetometer and the detuning is 200 MHz towards lower frequencies from the F=2→F'=1 component of the $^{87}$Rb D1 line.

FIG. 7A shows the differential gradiometer signal. FIG. 7B shows the signal from each arm of the magnetometer.

FIG. 8A shows the gradiometer signal with closed feedback loop on the primary-channel magnetometer. FIG. 8B shows the signal from the primary-channel magnetometer with the feedback loop open.

FIG. 11 is a graph of the signal in nanoGauss (nG) versus delay time that shows the remotely measured point-by-point free induction decay in the top graph and the corresponding Fourier transformation in frequency domain in the bottom graph.

Figure 12A:
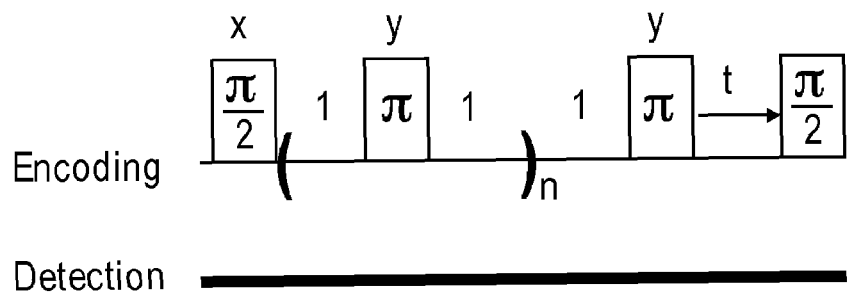
Figure 12B:
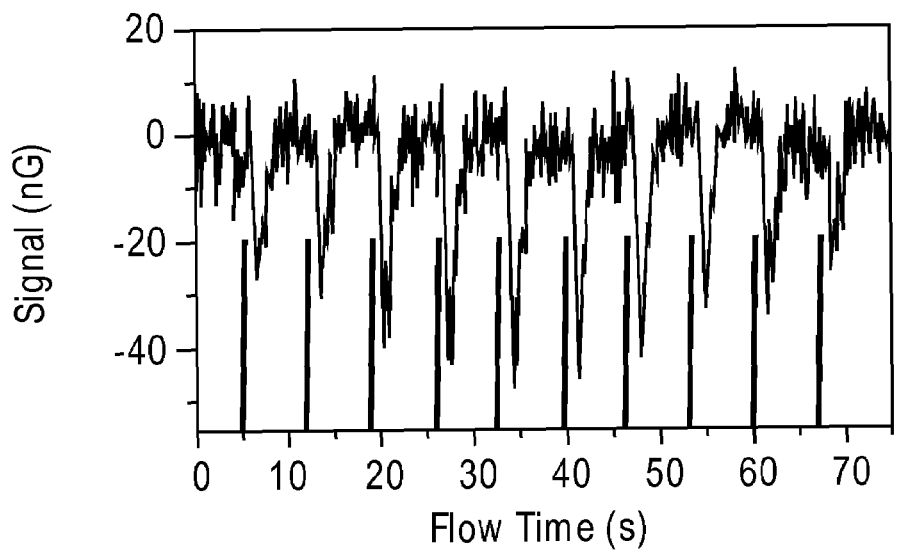
Figure 12C:
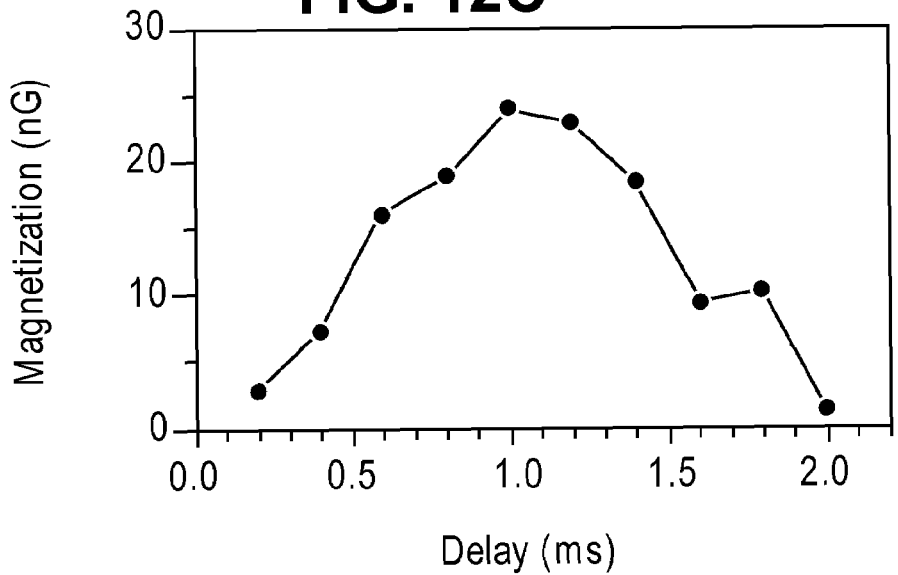

FIGS. 12A-C are graphs of the pulse sequence for the spin echo reconstruction and the resulting spin echo. FIG. 12A shows the pulse sequence. The echo time, which equals to the delay between two consecutive π pulses, is 2 ms, and the repetition number n is 50. The phases of the RF pulses are indicated above their respective positions. FIG. 12B shows the data directly measured by the gradiometer, with the spikes indicating the timing of encoding. FIG. 12C shows the baseline-corrected difference signal extracted from FIG. 12B.

Figure 13A:
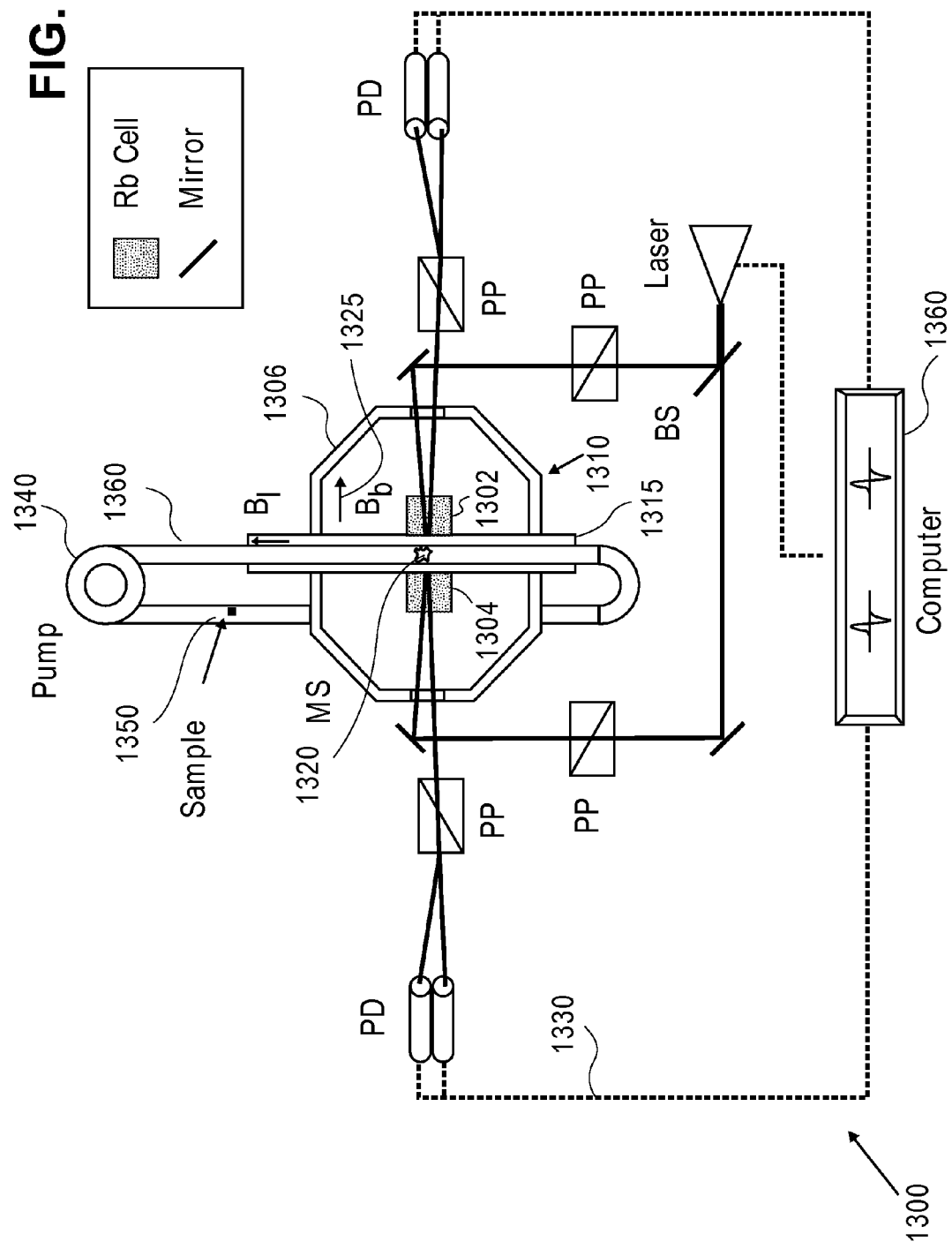

FIG. 13A is a schematic diagram of one setup for continuous flow particle detection, where the terms BS means beam splitter; PP means polarizer prism; PD means photodiode; MS means magnetic shield.

Figure 13B:
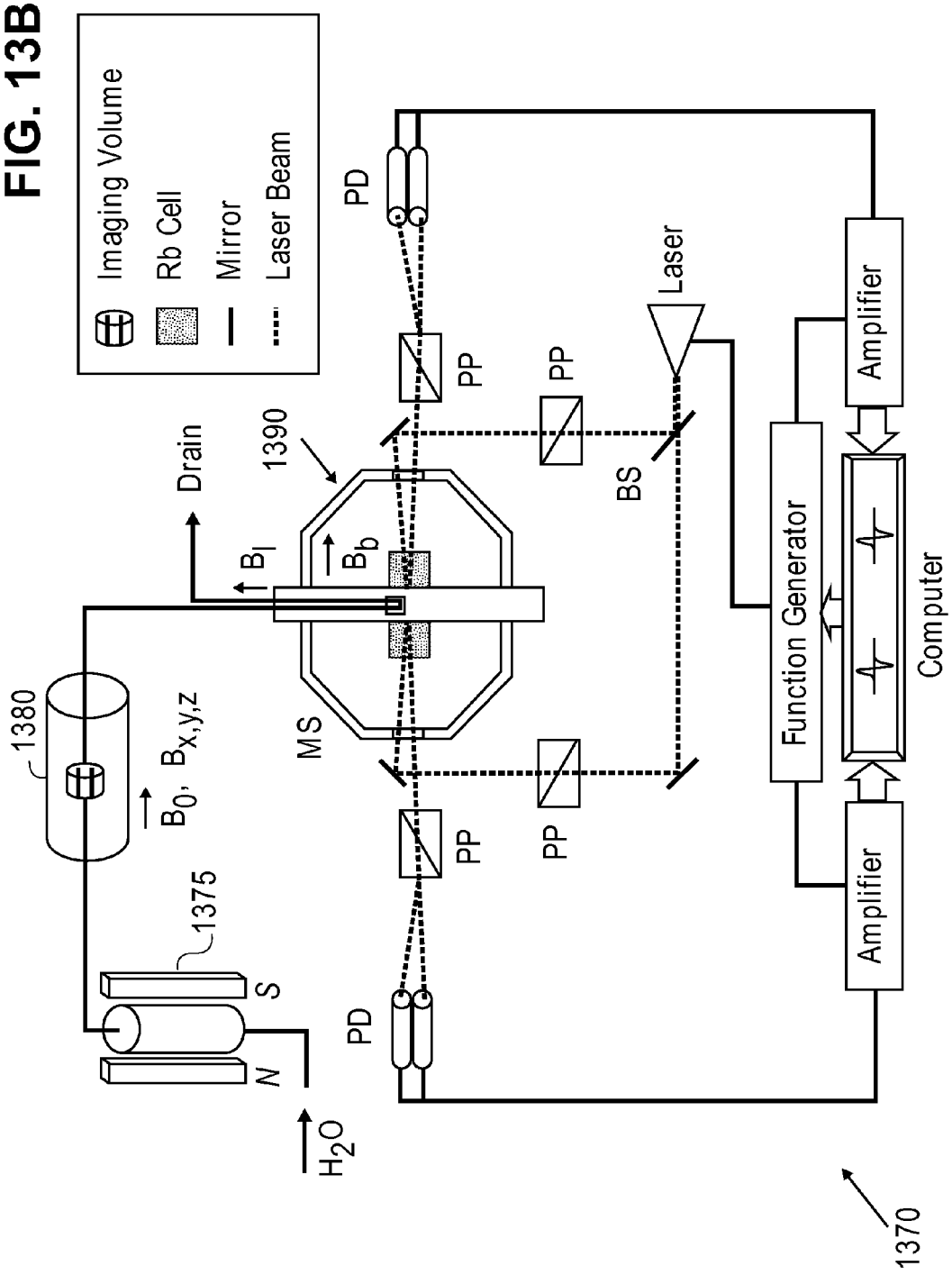

FIG. 13B is an alternate schematic diagram for one-way flow particle detection.

Figure 13C:
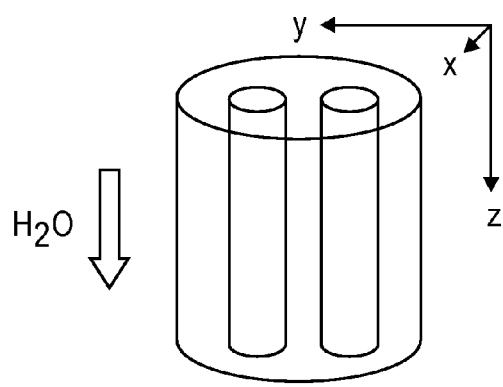

FIG. 13C is particular test setup magnetic resonance image encoding volume. The two channels are 3.2 mm in diameter and 25 mm long each, with a center-to-center spacing of 5.1 mm.

Figure 13D:
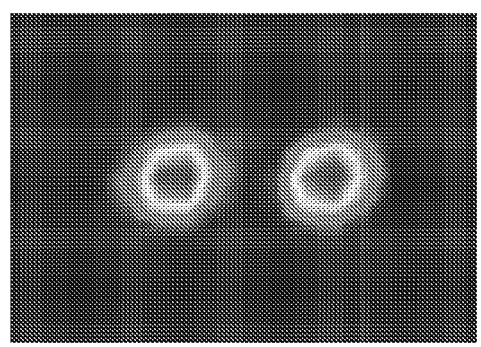

FIG. 13D is an image of the cross-section of the encoding volume perpendicular to the flow (in the xy plane) at t=1.1 s.

Figure 13E:
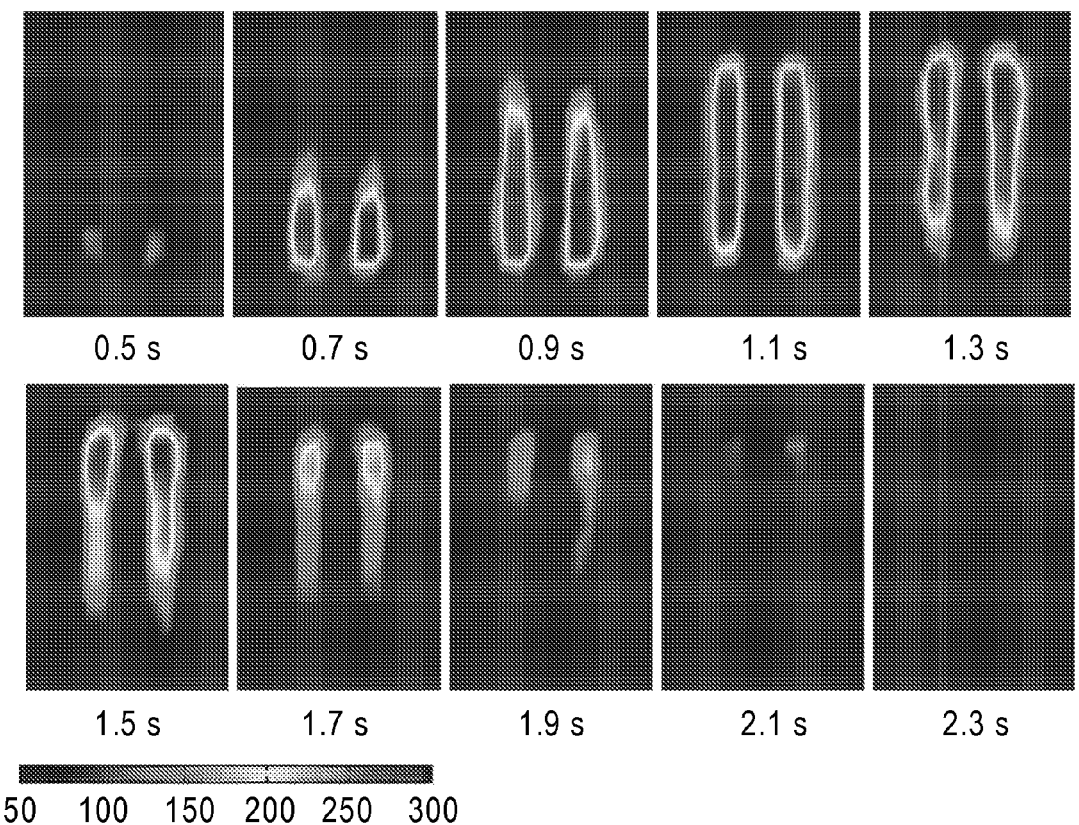

FIG. 13E is a set of time-resolved images in the yz plane. Measurements were obtained with a time interval of 0.1 s. All of the images are color-mapped at the same scale, as indicated below the images. The total experimental time for these flow images is 12 h, which is dominated by the waiting time between measurements to allow the sample from the previous measurement cycle to clear the system. The overall time would be reduced to minutes for shorter travel distances.

FIG. 14 shows graphs of detection of a circulating cobalt particle carried by water at two different flow rates: (a) 30 ml/min; (b) 150 ml/min.

FIG. 15 shows graphs of detection of 18 nl superparamagnetic magnetite suspension ($4\times10^5$ particles): (a) typical real time detection; (b) averaged signal (peak-to-peak) of ten consecutive measurements as a function of experimental time.

Figure 16:
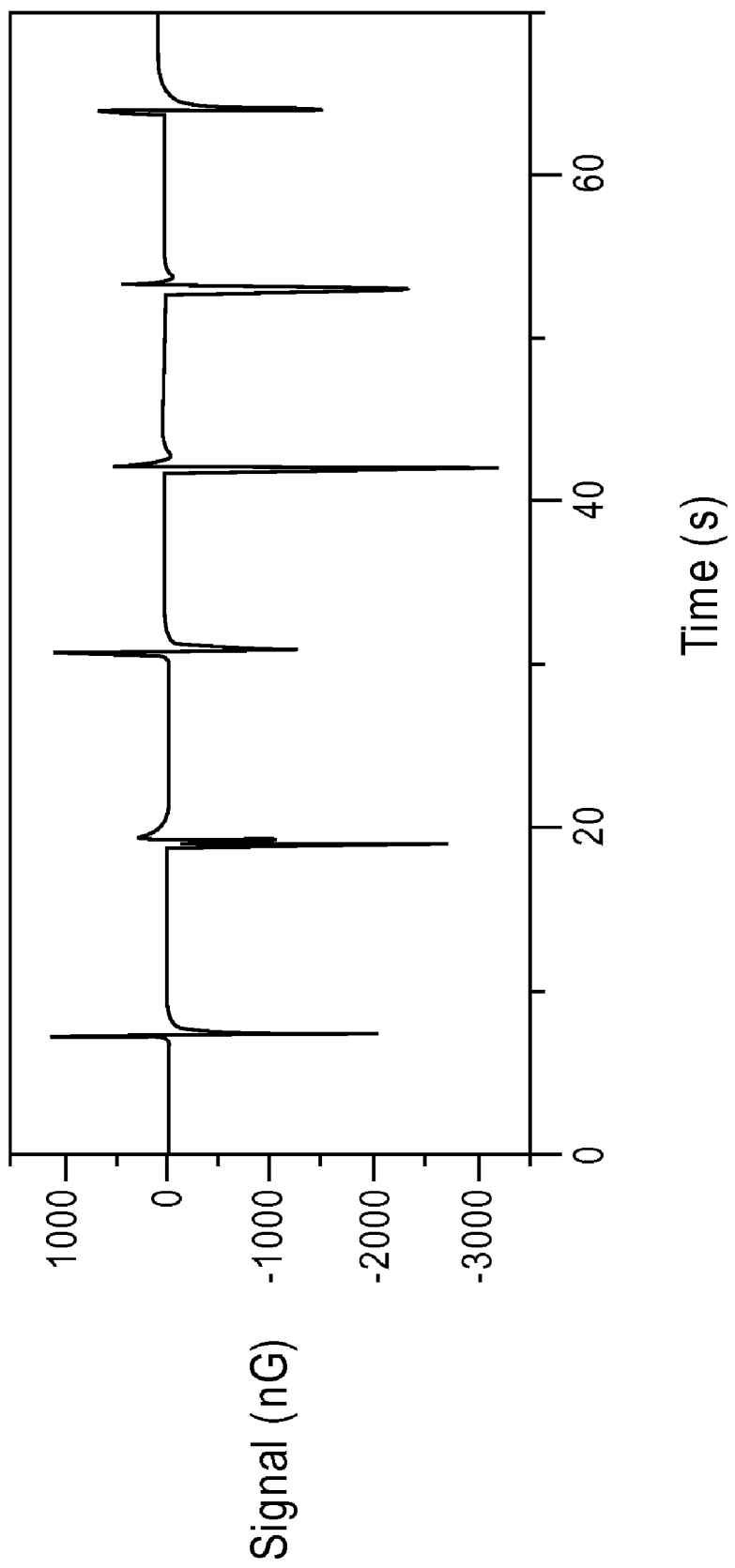

FIG. 16 shows a graph of detection of 18 nl ferromagnetic fluid of cobalt nanoparticles (8.2% in kerosene).

DETAILED DESCRIPTION OF THE PREFERRED EMBODIMENT

Definitions

Alkali cell means an encapsulated sample of an alkali metal that generates an alkali-metal vapor, which is capable of detection of magnetic fields through changes in nonlinear magneto-optical rotation of a laser light polarization passing through the cell. Examples of such cells include, but are not limited to: cesium, rubidium, potassium, and sodium. Ideally, such cells are substantially isotopically pure.

Gradiometer means a set of at least two alkali cells in close proximity to a sample, such that common mode magnetization noise is rejected, thereby increasing the signal to noise ratio. For simple common mode rejection, just two cells may be used. For higher order mode rejection, more cells are used. Even more cells may be used for higher order mode rejection in two or three generally linearly independent dimensions.

Laser-based atomic magnetometer means a device capable measuring magnetic fields through the use of a laser. Ideally, the device is capable of direct quantization of nuclear magnetic fields including, but not limited to, nuclear magnetic resonance, magnetic resonance imaging, magnetic resonance spectroscopy, and detection of magnetic particles.

PIN diode means a diode with a wide, undoped intrinsic semiconductor region between p-type semiconductor and n-type semiconductor regions.

Photodiode means a device capable of measuring the amplitude of laser light passing through an absorptive section of an alkali cell.

Polarization Detector means a device capable measuring an ambient magnetic field through changes in the polarization of a laser beam passing through the device. At this time, an alkali cell is capable of being a polarization detector.

Signal Detector means a device capable measuring changes in a polarization detector that are related to the polarization of laser light incident upon the polarization detector.

I. Construction and Applications of an Atomic Magnetic Gradiometer Based on Nonlinear Magneto-Optical Rotation Introduction This invention includes the design, characterization, and applications of a sensitive atomic magnetic gradiometer. The device is based on nonlinear magneto-optical rotation in alkali-metal (such as $^{87}$Rb) vapor, and uses frequency-modulated laser light. The magnetic field produced by a sample is detected by measuring the frequency of a resonance in optical rotation that arises when the modulation frequency equals twice the Larmor precession frequency of the Rb atoms. The gradiometer consists of two atomic magnetometers. The rotation of light polarization in each magnetometer is detected with a balanced polarimeter. The sensitivity of the gradiometer is 0.8 nG/Hz$^{1/2}$ for near-DC (0.1 Hz) magnetic fields, with a baseline of 2.5 cm. For applications in nuclear magnetic resonance (NMR) and magnetic resonance imaging (MRI), a long solenoid that pierces the magnetic shields provides a ~0.5 G leading field for the nuclear spins in the sample.

This apparatus is particularly suited for remote detection of NMR and MRI. A point-by-point free induction decay measurement and a spin echo are reconstructed with their respective appropriate pulse sequences, the latter being similar to the Carr-Purcell-Meiboom-Gill (CPMG) pulse. Additional applications and future improvements are also discussed.

Atomic magnetometry as applied to the detection of nuclear magnetism has a rather long history, starting with the pioneering work by Cohen-Tannoudji and coworkers in the 1960s.[1] In that work, alkali vapor was used to measure the magnetization of optically hyperpolarized $^3$He. Since then, it has been developed by Newbury and coworkers[2] toward a more sensitive and convenient technique. The sensitivity of an optimized, shot-noise limited atomic magnetometer is determined by $$\delta B \approx 1/(\gamma\sqrt{Nt\tau}), \quad (1)$$

where γ is the atomic gyromagnetic ratio, N is the total number of the gaseous alkali atoms participated in the measurement, t is the measurement time, and τ is the coherence lifetime.

Recently, several novel approaches to atomic magnetometry have been demonstrated with extraordinarily high sensitivities. One approach is the use of potassium vapor at high enough densities that the effect of spin-exchange relaxation effectively cancels.[3,4] This so-called spin-exchange relaxation-free (SERF) technique has achieved a sensitivity of 5 pG/Hz$^{1/2}$. Another path uses low-density rubidium vapor in paraffin-coated cells to reduce the spin-relaxation rate and create ultra-narrow resonances in nonlinear magneto-optical rotation.[5,6] The latter technique employs frequency- or amplitude-modulated laser light to synchronously pump alignment in the atomic ground state.[7-9] A narrow resonance occurs when the modulation frequency is equal to twice the Larmor precession frequency γB, allowing precise determination of the magnetic field. It is believed that with this technique, sensitivity below 10 pG/Hz$^{1/2}$ should also be achievable.

One embodiment of the present invention is to apply atomic magnetometry to nuclear magnetic resonance (NMR) and magnetic-resonance imaging (MRI). NMR and MRI are prominent and versatile techniques that have found applications in many areas.[10,11] However, magnetic resonance techniques suffer from poor sensitivity in low magnetic fields: with conventional Faraday-induction detection using a radiofrequency (RF) coil the signal is proportional to the strength of the magnetic field (assuming a given degree of nuclear polarization). Thus alternative detection methods are desirable when the use of high magnetic field is to be avoided. Atomic magnetometers[12,13] and superconducting quantum interference devices (SQUIDs)[14-16] have both been proven to possess such sensitivity. Early applications of atomic magnetometers in NMR include measurements of the T$_1$ relaxation of hyperpolarized xenon[12] and the free induction decay of protons in an ultra-weak magnetic field inside a magnetometer.[13] One advantage of atomic magnetometers is that, unlike SQUIDs or superconducting magnets, they do not require cryogenics, making them more convenient and less expensive to build and operate.

To improve the "filling factor", the degree to which the sample couples to the detector, atomic magnetometry may be combined with a complementary detection scheme—remote detection.[17-19] In remote detection, the spectroscopic (for NMR) and spatial (for MRI) information is stored as time-dependent total magnetization of the sample along the longitudinal axis. Detection is performed at a different location from the encoding region. The encoded information can be recovered via Fourier transformation of the sample magnetization measurement. If the sample is spread out spatially, which precludes efficient NMR detection, the remote detection method can offer a significant advantage, as the sample can be concentrated in the detection region improving the sensor coupling to the sample (commonly referred to as the filling factor in NMR) and detection efficiency. It also opens up the possibility of implementing more sensitive detection methods for NMR and MRI, including atomic magnetometry. Since the detection is physically separated from the encoding step, the RF magnetic fields and gradient magnetic fields used for spin encoding do not interfere with the sensitive magnetometers.

One additional consideration for low-field NMR and MRI is that thermal magnetization is intrinsically low (typically $10^{-8}$). This problem can be circumvented by using pre-polarization, for example, through spin exchange with optically pumped rubidium atoms in the case of $^{129}$Xe and $^{3}$He nuclei[20] (up to tens of percent polarization), or magnetization by a strong magnetic field prior to the encoding step.[21]

Figure 1:
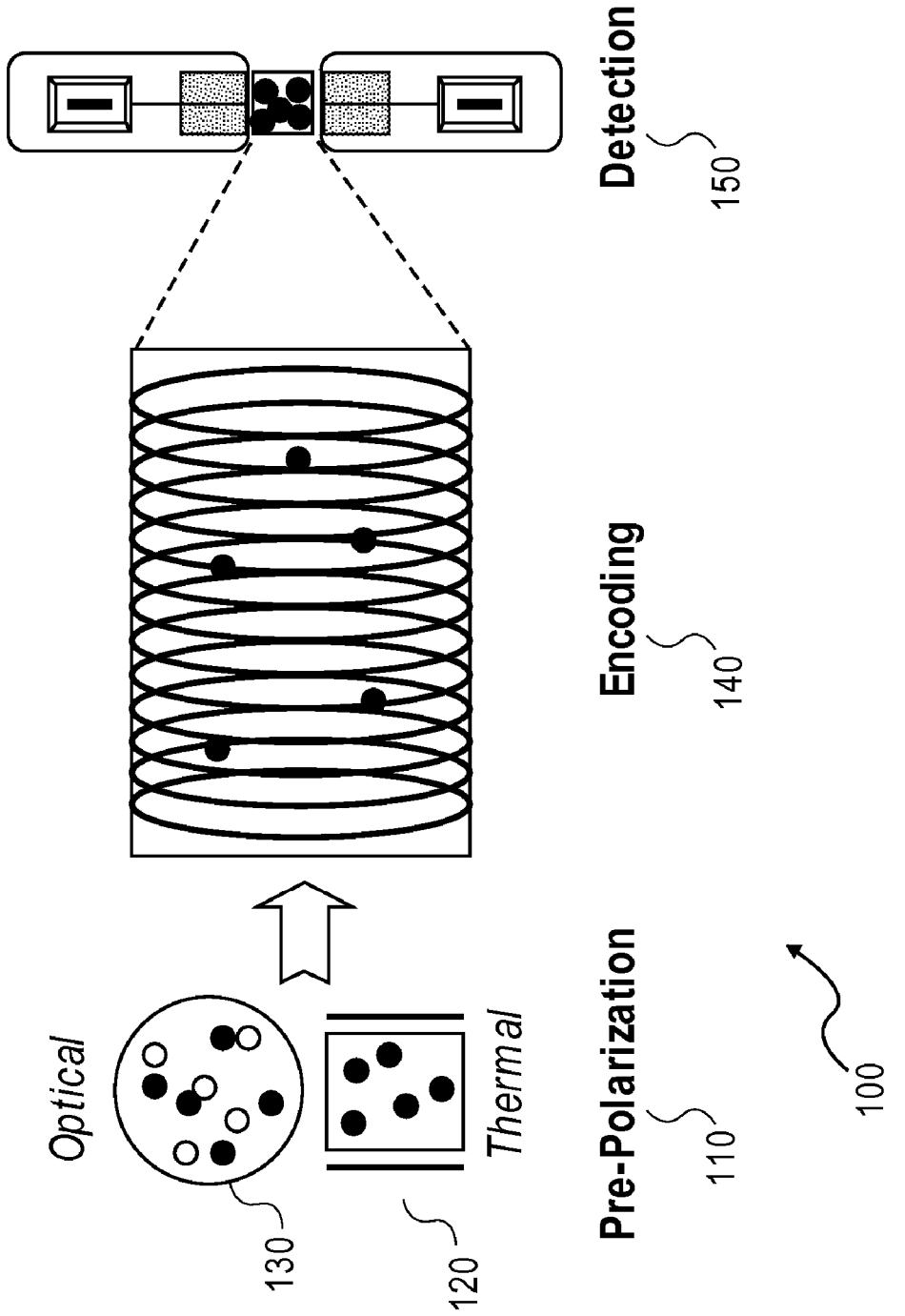
FIG. 1 is a schematic of one concept of remote detection of NMR and MRI with atomic magnetometers. A gradiometer formed by two magnetometers is shown as an example.

FIG. 1 illustrates one technique of applying atomic magnetometry to remote detection in low-field NMR and MRI 100. It comprises three essential steps: pre-polarization of the nuclear spins 110, low field encoding 140, in which the pulse sequences are applied, and detection with sensitive atomic magnetometers 150. The prepolarizing step may be achieved through thermal polarization 120, optical polarization 130, cryogenic polarization for hydrogen molecules (not shown), or dynamic nuclear polarization (not shown). Thermal polarization may be achieved even with highly inhomogeneous magnetic fields, such as those formed around a single permanent magnet.

Here is described a new atomic magnetometer that was recently used for remote detection of time-resolved MRI.[21] Compared to the magnetometer used in Ref. 12, the new instrument possesses an improved filling factor, better stability, and an optimal geometry for various applications. The details of the apparatus and characterization are provided in the following sections, followed by examples of NMR measurements and a brief conclusion and outlook.

Apparatus

Figure 2:
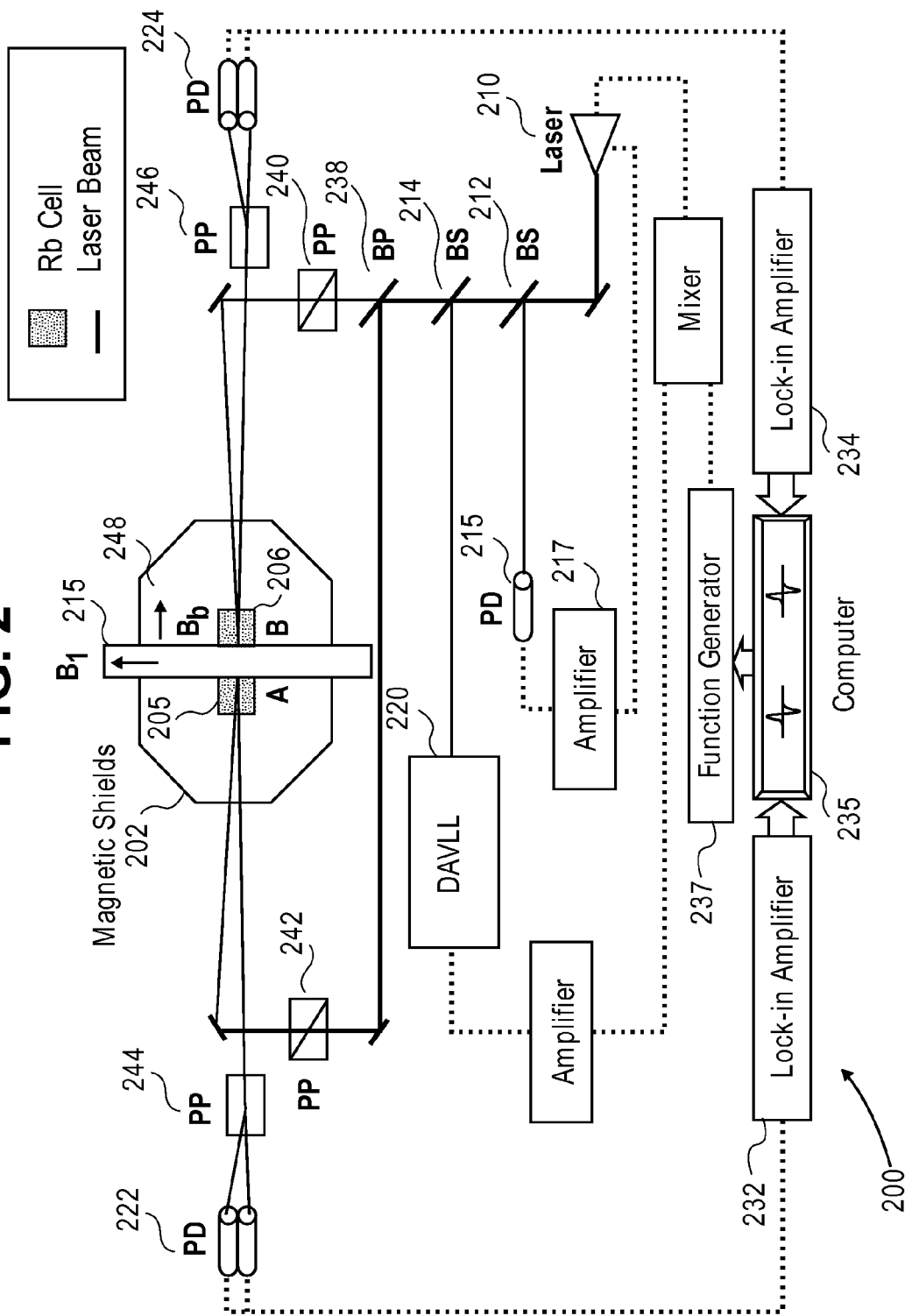
FIG. 2 is a schematic of an atomic magnetic gradiometer based on nonlinear magneto-optical rotation. Abbreviations: BS, beam sampler; BP, beam splitter; PD, photodiodes; PP, polarizing prism. The rubidium vapor cells are labeled as A and B. The thickness of the laser beam (gray lines in the diagram) symbolically indicates the relative beam power. In between the two cells is the piercing solenoid. $B_1$: leading field provided by the piercing solenoid; $B_b$: bias magnetic field.

One schematic of a laser-based atomic magnetometer 200 is shown in FIG. 2A. The main components include a multi-layer magnetic shield with internal coils 202, a pair of rubidium vapor cells 205, 206, a diode laser 210 with associated control electronics and optics (generally not shown, except for various unlabeled turning mirrors), a piercing solenoid 215, and electronics for signal amplification and data acquisition.

Magnetic Shield and Internal Coils

Figure 3:
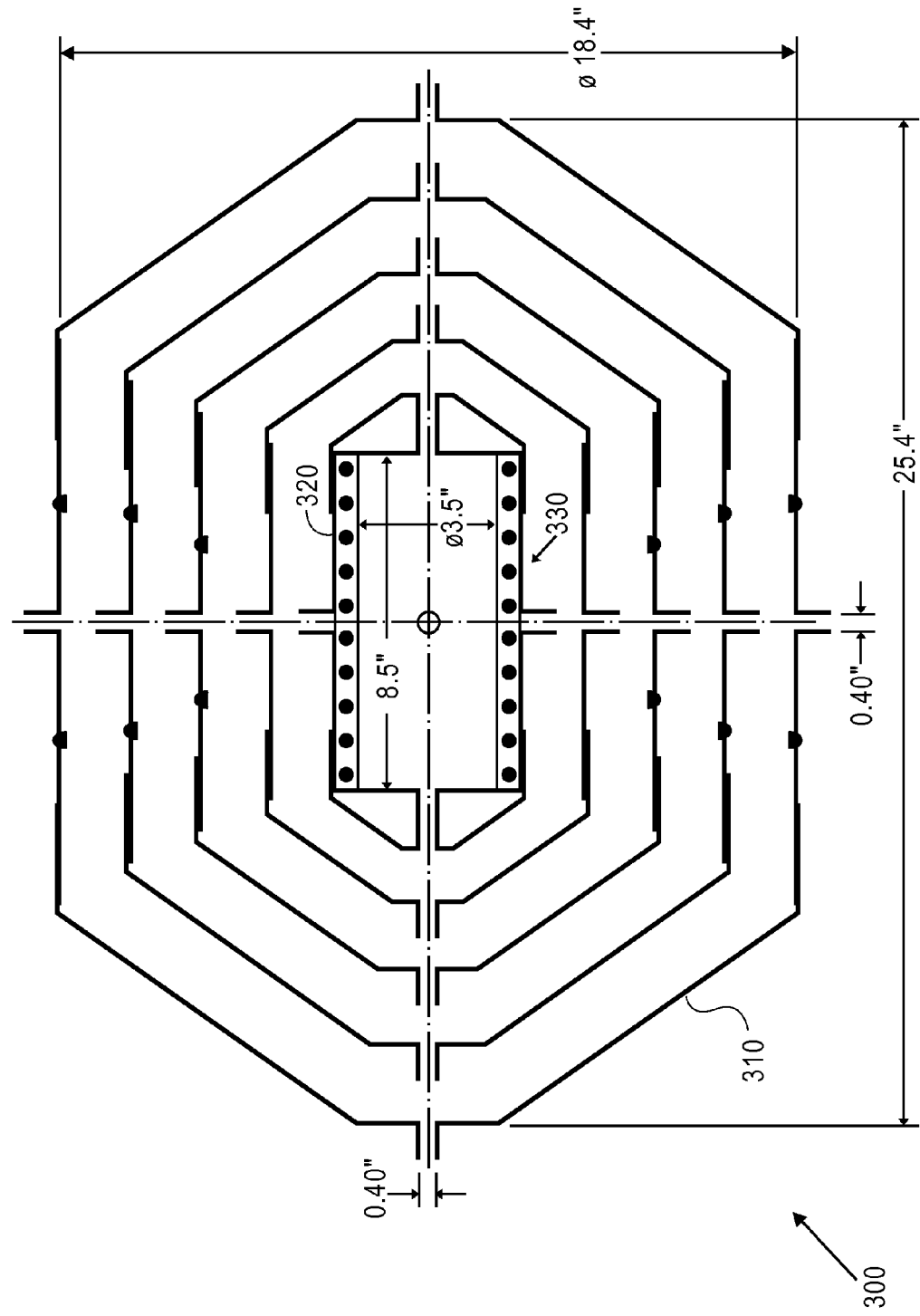
FIG. 3 is a cross-section of the magnetic shields. Internal coils are indicated with black dots. The Teflon coil holder inside the magnetic shield is shown in gray. The rubidium vapor cells are mounted on a platform located at the center of the magnetic shield (not shown).

To reduce the laboratory magnetic field, a five-layer magnetic shield 300 is employed (FIG. 3). The shield is made of a high-permeability alloy (0.1 cm thick). After manufacture (by Amuneal, Inc. according to one design embodiment), the shields were annealed in a hydrogen atmosphere. Mechanical stresses were avoided on the shield and exposure to high magnetic fields after annealing; demagnetization of the shield is not necessary. Each of the five layers 310 consists of a cylindrical center piece and two removable end caps. The overall shape of each layer approximates a sphere to maximize the shielding factor, while avoiding elements with difficult-to-manufacture shapes. Between the layers, Styrofoam (polymerized in place) is used to hold the shield in place and to provide thermal insulation from the environment. Four ports are available on the cylindrical part and one each on the end caps for each layer. They are aligned respectively among different layers during assembly and are used for optical access, the piercing solenoid and sample inlet, cell mounting, and electric connections. The shielding factor of the whole assembly was measured to be better than $10^7$ for low-frequency magnetic fields.

A set of coils 320 is mounted on a hollow cylindrical Teflon holder 330 inside the magnetic shield, including a solenoidal bias-field coil, two planar transverse-field coils, and three gradient coils. These coils are used to balance the residual magnetic field and gradients and to provide a bias field. The bias field is directed along the center-to-center line of the rubidium cells, defined as the z-axis, and parallel to the laser path (Faraday geometry in optical rotation). Since the sample magnetic field is much smaller than the bias field, the gradiometer is only sensitive to the magnetic field change along the z-axis. The z-gradient coil, driven by an adjustable DC source (such as the Krohn-Hite, Model 523), is used to balance the two magnetometers, so that their resonance frequencies are close to each other, usually within 0.5 Hz. The other coils are powered by dry batteries through resistors with low temperature coefficients (~0.6 ppm/° C.).

Rubidium Vapor Cells

The vapor cells containing isotopically enriched rubidium-87 ($^{87}$Rb) used in this apparatus are glass cubes with external dimensions 1 cm on a side and wall thickness of approximately 1 mm. Smaller cells have dimensions of about 2 mm by 4 mm are also readily available, as well as others fabricated to special orders. Compared to a 10-cm diameter cell such as that used in Ref. [12], these cells can be placed much closer to the sample, significantly improving the filling factor. The inner walls of the cells are coated with a layer of paraffin to minimize relaxation of ground-state polarization due to collisions with the wall.[22] Magnetometers using such buffer-gas-free anti-relaxation coated vapor cells measure the average of the magnetic field over the cell's volume. For a spherical cell, the average field is equal to the field at the center of the cell. While this is not exactly true for the cubic cells used in this work, this is still a reasonable approximation.

The total number of rubidium atoms in the vapor in smaller cells can be increased by raising the operating temperature. The heating method has to be carefully chosen to avoid introducing extra noise. Twisted Teflon-coated stainless steel wire was wound around the outside of the innermost layer of the magnetic shield. The magnetic noise generated by the heating current is largely cancelled and shielded by this method. Continuous heating by a current-regulated DC power supply has proven to be the best option.

The paraffin coating melts at approximately 60° C., which sets an upper limit for the cell temperature in this instance. For cells not using paraffin, higher operating temperatures may be achieved. The temperature is also constrained by the need to keep the alkali vapor density low enough that the alkali-alkali collisions do not unduly increase the relaxation rate. An operating temperature of 43° C. gives maximum signal-to noise ratio in this apparatus.

The cells are mounted on a Teflon platform. The positions of the cells can be independently adjusted by six Nylon alignment screws. A sturdy plastic rod goes through the magnetic shield via the bottom port to connect the platform to a translation stage on the laser table. This allows slight adjustment of the position of the platform from outside of the magnetic shield.

Laser Control and Optical Layout

Referring back to FIG. 2A, a single laser 210 (such as the NewFocus, Vortex 6000), frequency-modulated by driving a piezo-electric transducer in the laser cavity with a function generator, is used for both magnetometers 206, 206. The beam is first attenuated by neutral-density filters (not shown in FIG. 2A). Two 5% beam samplers 212, 214 are used for controlling the laser 210. The first one 212 feeds a photodiode 215 for power monitoring. The voltage output of the photodiode 215 is amplified by amplifier 217 and fed back to the laser 210 for constant-power operation. The second beam sampler 214 loop is used for a Dichroic Atomic Vapor Laser Lock 220 (DAVLL; a similar design is described in Ref. 23), employed to lock the laser 210 at an optimal wavelength. (The DAVLL contains an uncoated rubidium cell placed in a ~200 G magnetic field, a quarter-wave plate, and two polarization prisms[24]). Linear magneto-optical rotation is detected by two photodiodes 222, 224 and amplified by respective lock-in amplifiers 232, 234 (such as a Stanford Research SR530). The output of the appropriately phased lock-in amplifier is fed back to the piezoelectric element of the laser to adjust the wavelength of the laser accordingly. Operation of a DAVLL with frequency modulated light extends the use of the device that is normally employed with unmodulated light[23,24].

The main laser beam passes through a 50-50 beam splitter 238 to produce a beam for each magnetometer 205, 206. For each magnetometer, an input polarization prism 240, 242 defines the initial polarization of the incident beam. The diameter of the laser beams at the cells is approximately 2 mm. After passing through its polarization detector cell 205, 206, the beam is reflected by an end mirror (aluminum coated on 1 mm glass substrate) mounted close to the back of the cell (not shown in FIG. 2A), passes through the cell 205, 206 again, and then through the respective analyzing prism 244, 246 oriented at 45° to its respective initial prism. This balanced polarimeter is sensitive to magneto-optical rotation induced by the Rb vapor.[25]

This double-pass arrangement, in which the beams are reflected back through the cells 205, 206, was chosen in order to allow the cells to be placed in an optimal position relative to the sample. The resulting increase in optical path length (the rotation is additive on the two passes) is also significant because of the small size of the cells used in this invention, and reduces the heating requirements for the cells.

Piercing Solenoid, Bias Magnetic Field, and Sample Polarization

For NMR applications, a leading field is required for the nuclear spins in the sample. This is provided by a long hollow solenoid 215 that pierces the magnetic shield 202. The field strength inside the solenoid 215 is ~0.5 G, approximately the earth-field strength. Since the rubidium vapor cells 205, 206 are located far from the ends (which are outside the magnetic shield), the solenoid field is very small at the cell positions.

A bias magnetic field 248, with a magnitude much larger than the sample magnetic field, is generated to define the detection axis of the gradiometer. This dictates that the sample (which would normally be approximated as a magnetic dipole aligned with the leading field in the piercing solenoid) be offset in the direction of the leading field from the axis connecting the centers of the sensor cells. In practice, the optimal position was chosen by using a calibration solenoid in place of the sample that could be moved along the piercing solenoid. The sample in the detection region produces magnetic fields with opposite direction in the two cells (as shown in FIG. 4).

Figure 4:
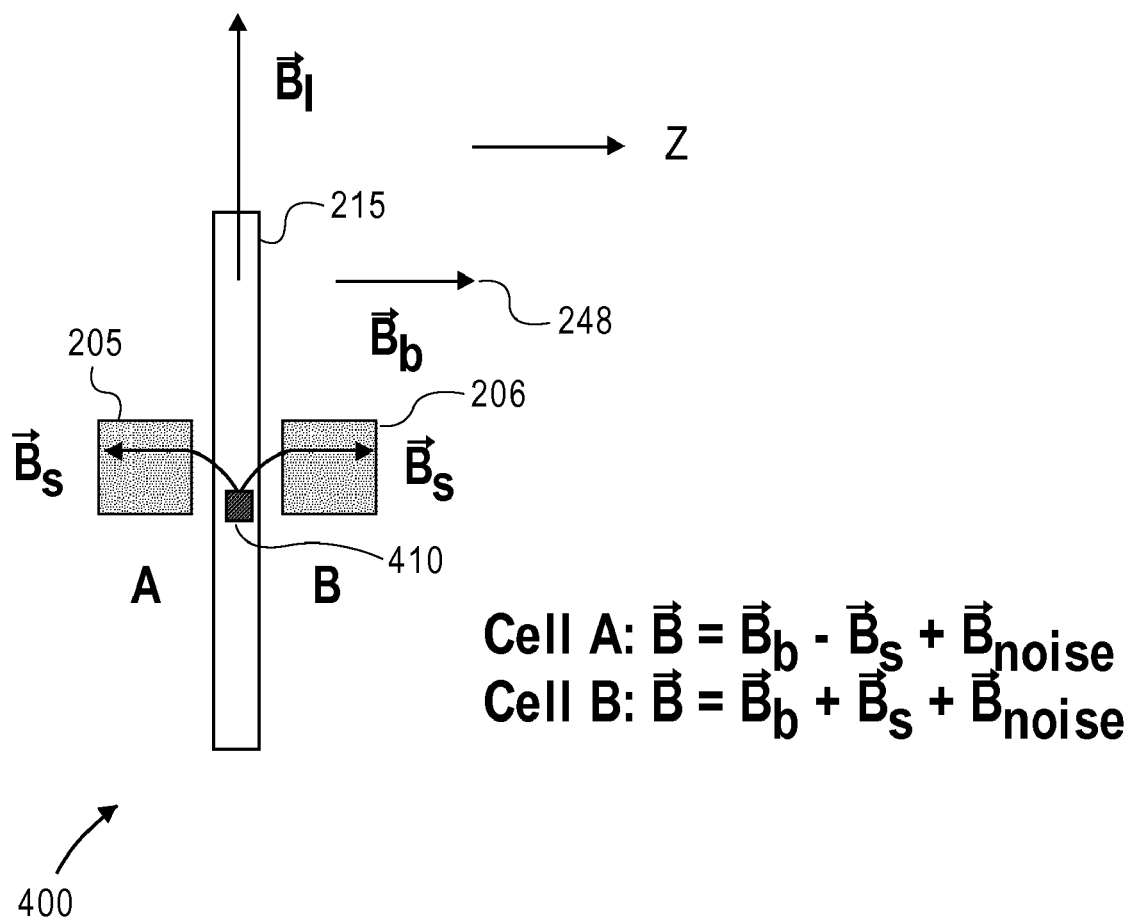
FIG. 4 is an illustration of the measurement geometry. $B_1$: leading field; $B_b$: bias field; $B_{noise}$: magnetic noise; $B_s$: magnetic field generated by the sample. Since the two rubidium cells experience magnetic field of opposite sign due to the sample, the difference between the two measurements will double the signal from the sample, while canceling common-mode noise.

Referring now to FIG. 4, one finds the details 400 of the fields near the center of the piercing solenoid 215. Polarization detectors 205 and 206 are arrayed on either side of a sample 410. Bias field $B_b$ (one can use a field strength of 0.70 mG to give a resonance frequency of ~1000 Hz for the modulation of the laser when no sample is introduced. The piercing solenoid 215 provides about a 0.5 me leading field $B_1$. Thus, the signal due to magnetization of the sample $B_s$, along the leading field adds in the gradiometer measurements, while common-mode noise ($B_{noise}$) cancels.

Signal Detection

The electronics for signal manipulation are fairly simple. For each magnetometer, the differential photocurrent between the photodiode pair is detected by lock-in amplifiers 232, 234 (Stanford Research, SR830). The outputs of the lock-in amplifiers are read to a personal computer 235 over a GPIB connection. A Lab View (National Instruments) program analyzes the signals, and controls the output frequency of a function generator 237 (Stanford Research DS 345) modulating the laser, using a feedback algorithm described below.

Characterization

Nonlinear Magneto-optical Resonance

Figure 6:
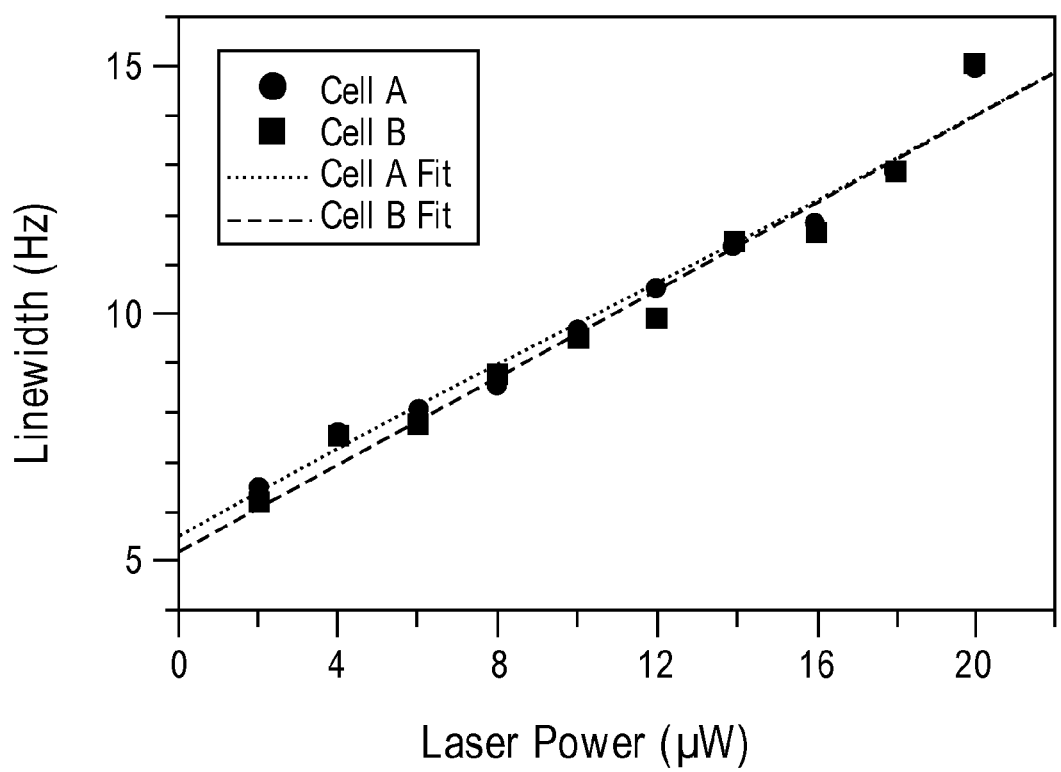
FIG. 6 is a plot of resonance linewidth vs. laser power. Laser power is measured immediately before the light beam enters a rubidium cell. The y-intercepts represent the intrinsic linewidths.

As part of the initialization of the magnetometer, the laser is detuned ~200 MHz towards lower frequency from the $F=2\rightarrow F'=1$ component of the $^{87}Rb$ D1 line, in order to produce the maximum optical rotation.[7] With the laser detuning fixed at the optimal position, the modulation frequency of the laser was swept to observe the nonlinear magneto-optical resonance, which occurs when the modulation frequency is equal to twice the Larmor precession frequency. The presence of a 0.48-mG bias field gives a resonance frequency of 680 Hz in the absence of the sample. FIG. 5 exhibits both the in-phase and out-of-phase (quadrature) outputs from the lock-in amplifier of each magnetometer. The widths of these resonances in the modulation-frequency domain correspond to twice the Rb ground-state coherence-relaxation rate (12 Hz and 13 Hz for the two magnetometers from the scans in FIG. 5). As indicated above [Eq. (1)], the longer the coherence lifetime, the better the sensitivity. To obtain the intrinsic linewidth, the linewidth (equal to that observed in the modulation-frequency domain divided by two) vs. laser power is plotted and extrapolated to zero power (FIG. 6). From linear extrapolation, the intrinsic relaxation rate is around 5.4 Hz for both cells, compared to 1.3 Hz for the 10-cm diameter cell used in Ref. [12]. This difference is primarily due to the smaller size of the cells used here, as the mean free path between wall collisions is much shorter. However, because of a factor of ~1000 improvement in the filling factor in the current setup, a substantial gain in overall sensitivity is achieved.

Data Acquisition Algorithm

Two strategies for locking a magnetometer to a resonance have been explored. The first strategy consists in tracking the resonance frequency by determining the center of the peak in the quadrature signal. This has an advantage of reduced sensitivity to background signals; however, it is slow because at least three points are needed to fit for the center frequency, and the system must be allowed to stabilize each time the modulation frequency is changed. In the second strategy (used for the experiments described below), the in-phase signal from one magnetometer, which is proportional to deviations from resonance in a limited range centered at resonance, is measured, inverted and fed back to the function generator which modifies the modulation frequency accordingly. The computer-implemented feedback is a PI (proportional and integral) loop, controlled by three parameters: P, I, and an integration range. The feedback signal f and error signal $\epsilon$ are related by:

$$f = P(\epsilon + I \int_{-t}^{0} \epsilon dt'). \quad (2)$$

Applying a square wave magnetic field as a test signal (such as the ones shown in FIGS. 7 and 8), the values for P and I are set according to the following algorithm. With I set to zero, increase P until the system begins to oscillate. Then set P at ~50% of the oscillation threshold and with a fixed integration range, typically set as 5 s, adjust I to optimize the response of the apparatus to minimum distortion from the testing square wave.

The magnetometer controlled by the feedback loop, designated as the primary channel, is thus always on resonance. The in-phase signal from the other magnetometer, the passive channel, is the differential measurement, free of common-mode noise. The feedback loop maintains the modulation frequency in the most sensitive regime, since the slope of the resonance feature is maximal at the center of resonance, which is 0.6 mrad/Hz. The advantages of a software PI loop include insensitivity to noise and flexibility in adjusting the parameters of the response function.

Noise and Sensitivity

A range of sources can contribute to the noise, including ambient air flow, stray light, dark current of the photodiodes, electronic noise from the lock-in amplifiers, and the mechanical vibrations of various components. One particularly significant noise comes from air circulation in the environment, causing refractive index fluctuation of the air in the laser path that leads to random optical rotation. This effect is greatly reduced by enclosing the entire beam path. The stray light is also blocked. The photodiodes are connected in pairs without bias voltage so that only the differential photocurrent is amplified, further reducing the dark current.

Figure 7A:
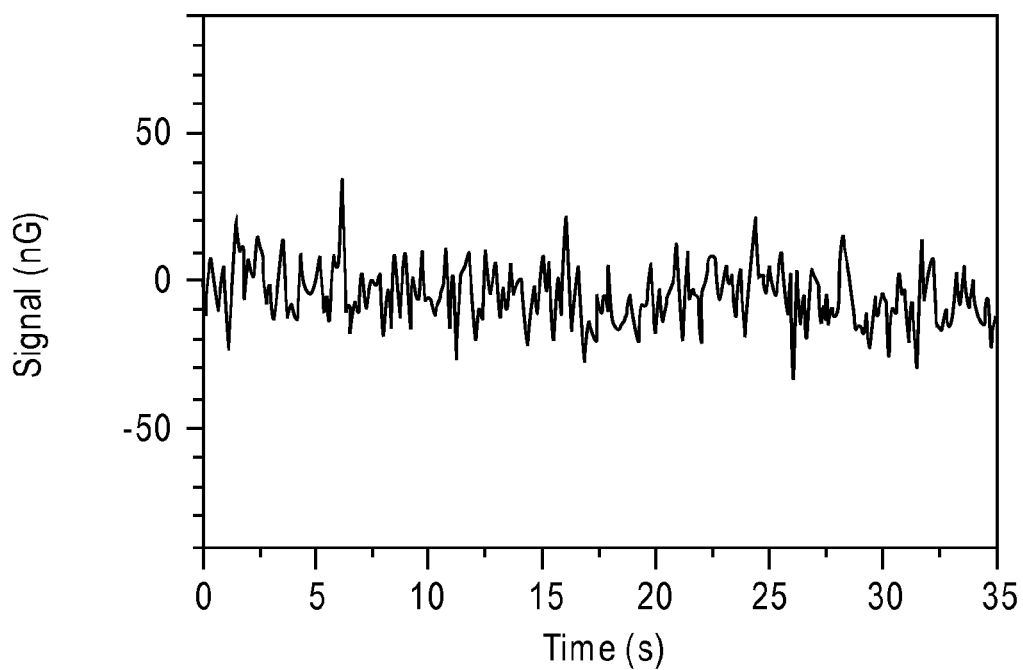
FIGS. 7A and 7B are a demonstration of the cancellation of a common-mode magnetic field by a gradiometer. A uniform 100 nG (peak-to-peak) square-wave magnetic field is applied using the z-coil.
Figure 7B:
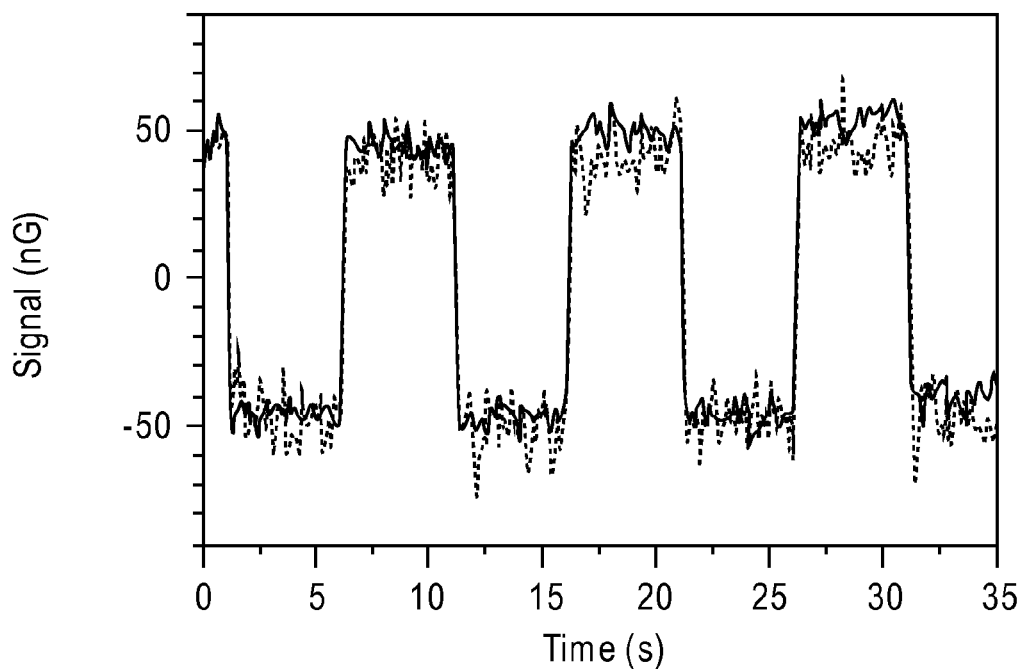
Figure 8A:
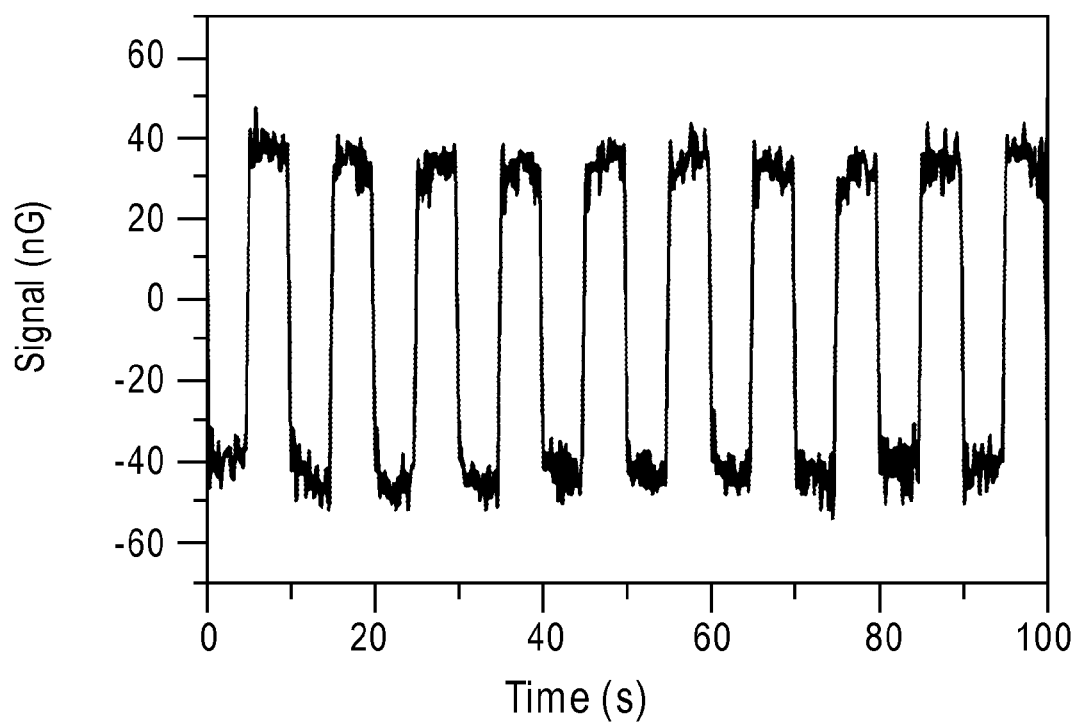
FIGS. 8A and 8B are a sensitivity comparison between the gradiometer and the primary channel. The test signal is a 40 nG magnetic field modulated at 0.1 Hz, produced by the z-gradient coil which is powered by a function generator.
Figure 8B:
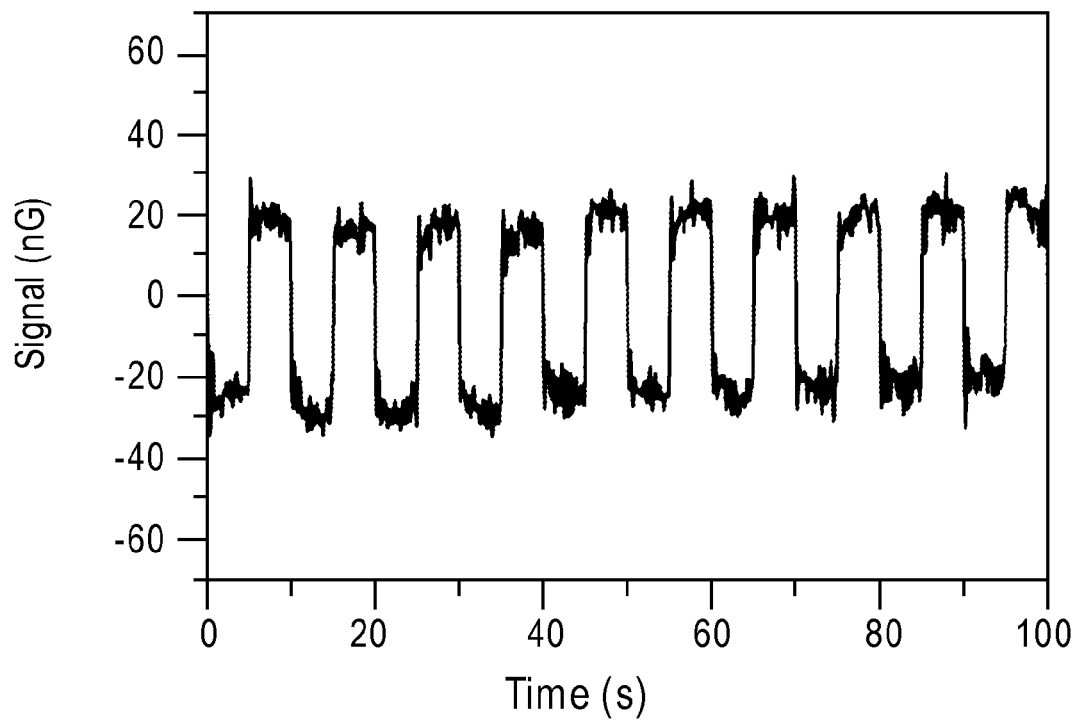

To demonstrate the common-mode cancellation of the gradiometer, a common-mode magnetic field modulated at 0.1 Hz is generated by the z-coil. As shown in FIG. 7, both magnetometers experience the magnetic field, while no evident signal is observed in the gradiometer. The common-mode-rejection ratio is estimated to be no worse than 20.

For calibration, a small gradient field square-wave with frequency 0.1 Hz is generated by the z-gradient coil. The measurements are presented in FIG. 8. Plot A shows a recording of the gradiometer signal with closed feedback loop on the primary-channel magnetometer. Plot B shows the signal from the primary-channel magnetometer with feedback loop open. By taking the differential signal between the two magnetometers, as mentioned above, the common-mode drift is reduced. In addition, the signal-to-noise ratio (SNR), limited by the intrinsic noise of the individual sensors, is improved by a factor of $\sqrt{2}$. The time constant for the measurement is 30 ms. The sensitivity of the gradiometer is estimated to be 0.8 nG/Hz$^{1/2}$ for the geometry applied in this work. The polarization noise level is therefore ~$10^{-3}$ mrad/Hz$^{1/2}$.

Applications

I. Applications of Atomic Magnetometry in Magnetic Resonance Imaging (MRI) and Nuclear Magnetic Resonance (NMR)

Figure 9:
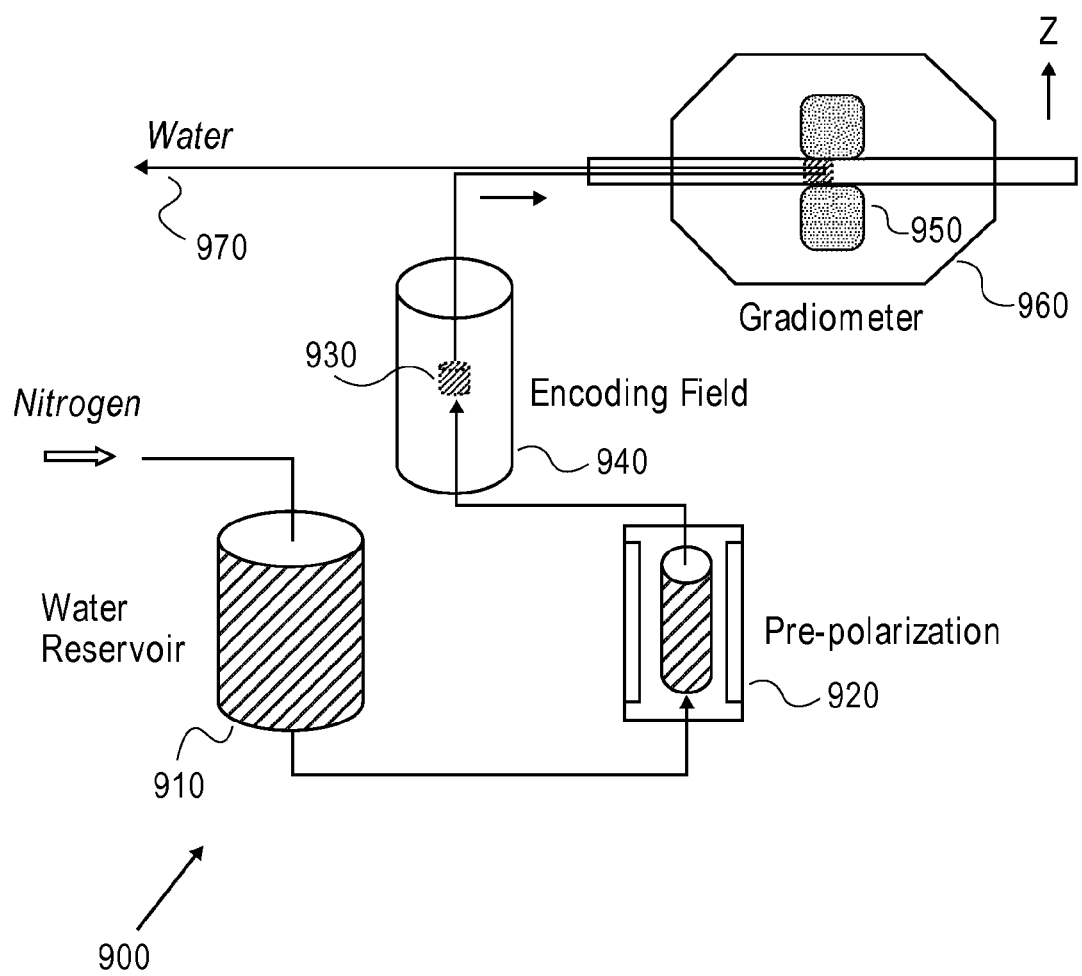
FIG. 9 is a schematic sample-flow diagram for an NMR experiment. Objects containing water are hatched.

The applications of this apparatus in MRI[21] have been reported. Now, one application is described of the remote detection of NMR schematically in FIG. 9. The setup 900, which is similar to the one used in Ref. 21. Initially, a water reservoir 910 contains water. Water flows continuously through three consecutive regions. It is first pre-polarized by a permanent magnet 920 with field strength of 3 kG. It then flows into a plastic sample holder 930 located at the center of the encoding field 940 of 31 G, corresponding to 131.3 kHz resonance frequency for protons. An RF coil (not shown in FIG. 9) tuned to the resonance frequency is used to excite the sample nuclei. Pulse sequences are controlled with a TecMag console (Orion 1999). Finally, encoded water flows into the gradiometer 950 within a magnetic shield 960 and returns 970 through the same port for drain, producing magnetic fields with opposite direction in the two cells for detection. The baseline of the measurement is set at the signal corresponding to the initial magnetization, $M_z$, of the sample when no RF pulses are applied. The largest signal change (drop) is referred to as maximum signal. The flow rate is set as fast as 30 ml/min, to minimize the relaxation of the nuclear polarization during the travel from the pre-polarization region to the detection region.

Figure 10:
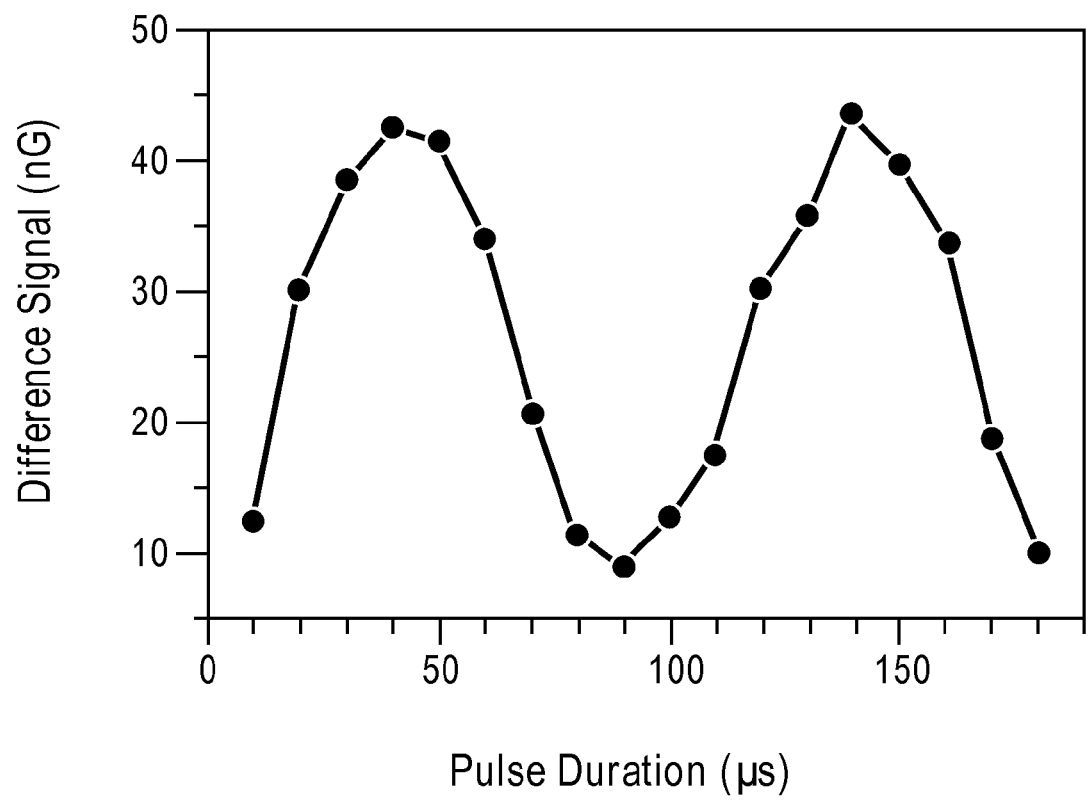
FIG. 10 is a graph of the difference signal versus pulse duration used in determining the time duration of the π/2 pulse. A pulse train with incremented pulse durations is applied in the encoding region. The difference signal measured by the gradiometer is plotted versus the pulse duration.

For NMR measurements, the $\pi/2$ pulse duration is determined by varying the pulse length and recording the corresponding magnetization of the sample, as shown in FIG. 10. The first maximum corresponds to a $\pi$ pulse as the magnetization is totally inverted so the gradiometer detects the largest difference. The minima correspond to $2n\pi$ pulses, n=0, 1, 2, since the magnetization is simply tipped back to its original direction. According to the data exhibited in FIG. 10, a $\pi/2$ pulse should be of 22 µs duration.

Free induction decay (FID) of the protons can be detected remotely by using two $\pi/2$ pulses with a variable delay between them. The frequency of the pulses is tuned to 132.7 kHz in order to shift the central FID frequency away from zero. The first $\pi/2$ pulse rotates the magnetization of the sample into the transverse plane (xy). During the delay, the magnetization precesses in the 31 G field. Then it is tipped back into the longitudinal direction z by another $\pi/2$ pulse. The stored magnetization is read out by the gradiometer. The magnetization as a function of the delay time, averaged over 10 data sets, is shown in FIG. 11. The Fourier transform of the FID gives the spectrum in the frequency domain. The peak frequency of 1.4 kHz is the difference between the carrier frequency and the resonance frequency. The full-width-half-maximum is approximately 400 Hz.

A more complicated pulse sequence (shown in FIG. 12A), similar to a Carr-Purcell-Meiboom-Gill (CPMG) pulse,[10] was also applied to obtain spin echo. A normal CPMG pulse is composed of an excitation $\pi/2$ pulse followed by a train of $\pi$ pulses which have a 90° phase shift relative to the $\pi/2$ pulse. The temporal spacing (echo time) between consecutive $\pi$ pulses is twice the time between the first $\pi/2$ pulse and the first $\pi$ pulse. Thus the coherence lost during precession due to field inhomogeneity can be recovered by inverting the magnetization each time by $\pi_y$ pulse. Multiple (n) $\pi$ pulses can be repeated until the total time of the pulse sequence reaches the intrinsic transverse relaxation time. (As many as 300 $\pi$ pulses have been tried, corresponding to a total time of 600 ms.) Because the spin echo is detected remotely, the preferred pulse sequence differs from a regular CPMG pulse in that an additional $(\pi/2)_x$ pulse after the regular CPMG pulse is needed to encode the signal into longitudinal magnetization. The spin echo is therefore reconstructed by sweeping the delay time t between this encoding pulse and the last $\pi_y$ pulse. The result (no signal averaging) is shown in FIGS. 12B & C. Panel B exhibits the data directly measured by the gradiometer. The grey spikes indicate the start of the pulse sequences, each with a different t, which is swept from 0.2 ms to 2 ms, with 0.2 ms step size. Panel C shows the baseline-corrected difference signal extracted from B. The spin-echo signal is maximum at t=1 ms, as expected for the spin echo.

Outlook

The apparatus described here offers high sensitivity for detecting DC magnetic field produced by a magnetized sample. As demonstrated here (and in Ref. 21) it is well-suited for low-field remote detection of NMR and MRI. In addition to the studies with water, one plan is to perform NMR and MRI experiments using hyperpolarized xenon. The setup can also be used in non-NMR/MRI applications. For example, detected magnetic particles have been detected with a high sensitivity and a large carrier throughput (in this case, water). Additional applications in other fields, such as measuring the magnetic properties of nominally non-magnetic ferroelectric materials and rock samples, are also in progress.

Further expected improvements include employing an array of rubidium cells as detectors and adopting a better geometric design. It is also planned to replace the external-cavity laser with an economic vertical-cavity-surface-emitting laser, integrate the electronics, and employ fiber optics for laser-beam transmission. With these modifications, it is expected to have an even less expensive and more convenient, potentially portable, apparatus for various practical applications.

II. Applications of Atomic Magnetometry in Magnetic Particle Detection

Next is shown the detection of magnetic particles carried by water in a continuous flow using an atomic magnetic gradiometer. Studies on three types of magnetic particles are presented: a single cobalt particle (diameter ~150 μm, multi-domain), a suspension of superparamagnetic magnetite particles (diameter ~1 μm), and ferromagnetic cobalt nanoparticles (diameter ~10 nm). Estimated detection limits for the system described here are 20 μm diameter for a single cobalt particle at a water flow rate 30 ml/min, $5 \times 10^3$ magnetite particles at 160 ml/min, and 50 pl for the ferromagnetic fluid of cobalt nanoparticles at 130 ml/min. Possible applications of this method are discussed.

Magnetic particles of micrometer and nanometer sizes are widely used in biomolecular labeling and cell separation[26-30], allowing manipulation of the components that are associated with the magnetic particles by an external magnetic field. These particles are also prevalent as contrast agents for magnetic resonance imaging[26-30].

In order to characterize the magnetization of these particles and monitor their behavior, a sensitive detection method is required. Several techniques have been developed for detecting weak magnetic fields, for example, superconducting quantum interference devices (SQUID)[31-32], giant magnetoresistive (GMR) sensors[33-34], vibrating sample magnetometers[35-36], and atomic magnetometers[37]. Magnetic resonance imaging (MRI) can also be used for diagnostics with magnetic microparticles[38]. Each method has both advantages and disadvantages. For example, SQUIDs offer ultrahigh sensitivity and have been used extensively to detect weak magnetic signals, but they require cryogenics. GMR sensors are relatively convenient to use, however they require the sample to be extremely close (on the order of microns) to the sensors. Vibrating sample magnetometry has relatively low sensitivity. While MRI is a powerful tool for noninvasive diagnostics, the cost of MRI machines severely limits their accessibility.

Here is explored the application of atomic magnetometry to detecting magnetic particles. Atomic magnetometry has reached sensitivity comparable to that of SQUIDs[6,15] without requiring cryogenics. Details of this approach to atomic magnetometry are provided elsewhere[7]. Briefly, the magnetometer is based on nonlinear (in light power) magneto-optical rotation (NMOR) of laser light interacting with rubidium atoms contained in anti-relaxation coated vapor cells. The frequency of the laser light is modulated (FM), and resonances in optical rotation are observed at modulation frequencies related to the Larmor precession frequency of the Rb atoms. The relationship between the external magnetic fields and the resonance modulation frequency $\omega_M$ is $$\omega_M \approx 2g\mu |\vec{B}_{bias} + \vec{B}_{sample}|,$$

where g is the atomic gyromagnetic ratio and μ is the Bohr magneton, i.e., a resonance occurs when the laser-modulation frequency is twice the Larmor precession frequency of the atoms. $\vec{B}_{bias}$ is an applied magnetic field that is much greater than the sample magnetic field, $\vec{B}_{sample}$ and so defines the detection axis. Therefore, the magnetic field from the sample along the direction of the bias field can be deduced from the frequency change of a magneto-optical resonance.

Refer now to FIG. 13A, which is a schematic of the experimental set-up 1300. Two identical anti-relaxation coated $^{87}$Rb vapor cells 1302, 1304 inside a multi-layer magnetic shield 1306 form a first-order gradiometer 1310 that is insensitive to common-mode noise from environmental fluctuations. A long piercing solenoid 1315 can be used to apply a leading field ($B_{lead} \leq 0.5$ G) on the detection region 1320. Because of the geometry of the arrangement, the leading field is not "seen" by the magnetometer cells. A bias field 1325 of 0.7 mG ($B_{bias}$) gives an FM NMOR resonance frequency of ~1 kHz in the absence of the sample 1350. When a magnetic sample 1350 produces, for example, a dipole field oriented along the axis of the piercing solenoid 1315, is introduced to the detection region (the volume within the piercing solenoid 1315 in the vicinity of the sensor cells 1302, 1304), the component of $\vec{B}_{sample}$ along $\vec{B}_{bias}$ is of opposite sign in the two sensor cells. The signal from one arm of the gradiometer (say 1330) is continuously fed back to the laser modulation to keep this magnetometer on resonance under computer control 1360. Thus the signal from the other magnetometer represents the difference field between the two cells created by the sample. Sensitivities have been achieved ~1 nG/Hz$^{1/2}$ for near-DC signal[40] (for frequencies ~0.1 Hz), with 1-cm-sized cells separated by 1.5 cm.

The magnetization of a cobalt particle with an estimated diameter of 150 μm was first measured. The sample 1350 was embedded into a small piece of Styrofoam, and magnetized by inserting it briefly into a 3 kG field of a permanent magnet (magnetization increased the observed signal by at least an order of magnitude). Water carrying the foam was circulated by a peristaltic pump 1340 through tubing 1360 (0.32 cm inner diameter) to the detection region 1320 of the gradiometer. As a control, an identical piece of Styrofoam without sample was also introduced into circulation.

FIG. 13B is a schematic of a one way flow device 1370 characterized by a prepolarizing section 1375, flowing into an encoding section 1380, flowing into the atomic gradiometer 1390, and out to a drain 1395.

In one experimental configuration, FIG. 13C shows a particular test setup magnetic resonance image encoding volume. The two channels are 3.2 mm in diameter and 25 mm long each, with a center-to-center spacing of 5.1 mm. FIG. 13D is an image of the cross-section of the encoding volume perpendicular to the flow (in the xy plane) at t=1.1 s. FIG. 13E is a set of time-resolved images in the yz plane. Measurements were obtained with a time interval of 0.1 s. All of the images are color-mapped at the same scale, as indicated below the images. The total experimental time for these flow images is 12 h, which is dominated by the waiting time between measurements to allow the sample from the previous measurement cycle to clear the system. The overall time would be reduced to minutes for shorter travel distances. As the time sequence progresses from t=0.5 s to t=2.3 s, one can see the sample enter the fluid sample volume 1320, fully fill the sample volume, and then exit the sample volume.

Figure 14A:
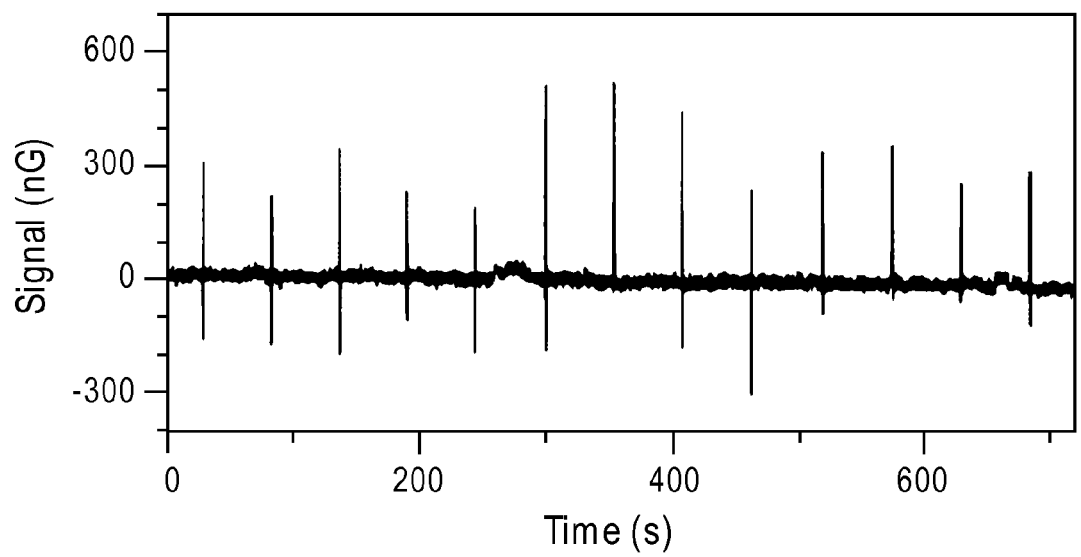
Figure 14B:
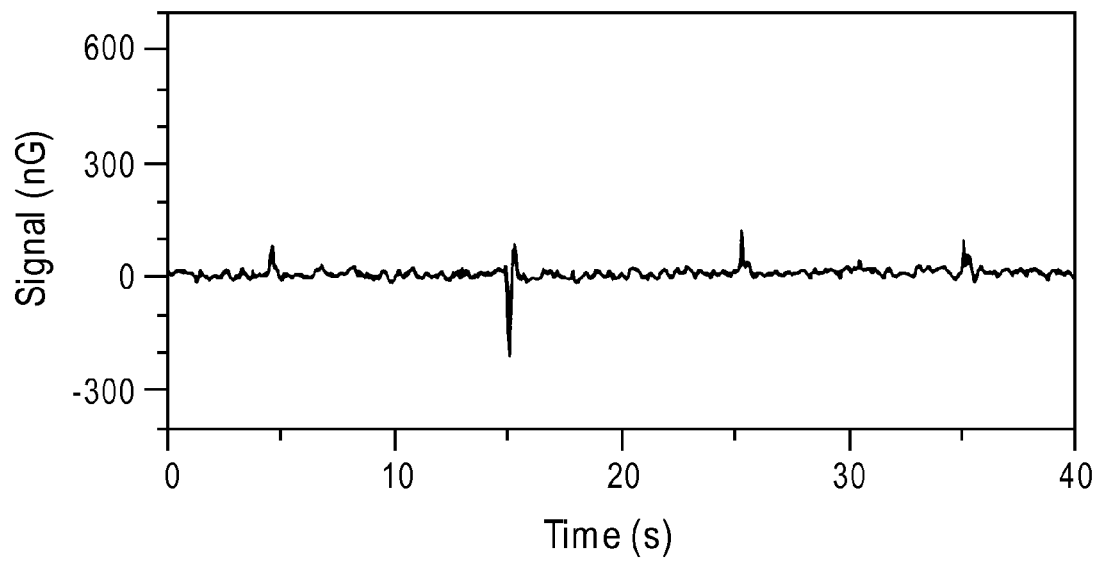

FIGS. 14A and 14B show the results for two flow rates, 30 ml/min (FIG. 14B) and 150 ml/min (FIG. 14A), which correspond to residence times of 160 ms and 30 ms, respectively, in the detection region. Each time the Styrofoam with the magnetic particle passed the gradiometer, a spike-like signal was produced, while the control Styrofoam produced no discernable signal. The average signal amplitude was much smaller for faster flow, since particle spent less time in the detection region. The magnitude and time dependence of the signal fluctuated between successive detections, most likely due to the random position and orientation of the particle in the detection region. From the signal-to-noise ratio in the slower flow, it was estimated that the detection limit was about a single cobalt particle with ~20 μm diameter. This estimation assumes multi-domain structure of the particles, and the scaling of their magnetic moment as square root of the volume. For single-domain particles, much smaller ones can be detected. In this case, one can estimate the detection limit to be ~5 μm diameter, given the present sensitivity of the gradiometer. The throughput can be increased up to 1200 ml/min using larger-diameter tubing, with the current spacing between the two cells. Therefore, such magnetic particles can be detected at essentially arbitrarily low concentrations in a large volume, and with high throughput.

Two types of smaller particles were measured similarly. One type was a superparamagnetic suspension containing amine-coated magnetite particles with ~1 μm diameter (Sigma-Aldrich, 17643). The sample was prepared by loading 18 nl of a suspension into a piece of capillary (diameter 150 μm, 1 mm length) and wrapping the capillary with Styrofoam. The total number of particles in the sample was ~4.5×10$^5$.

Figure 15A:
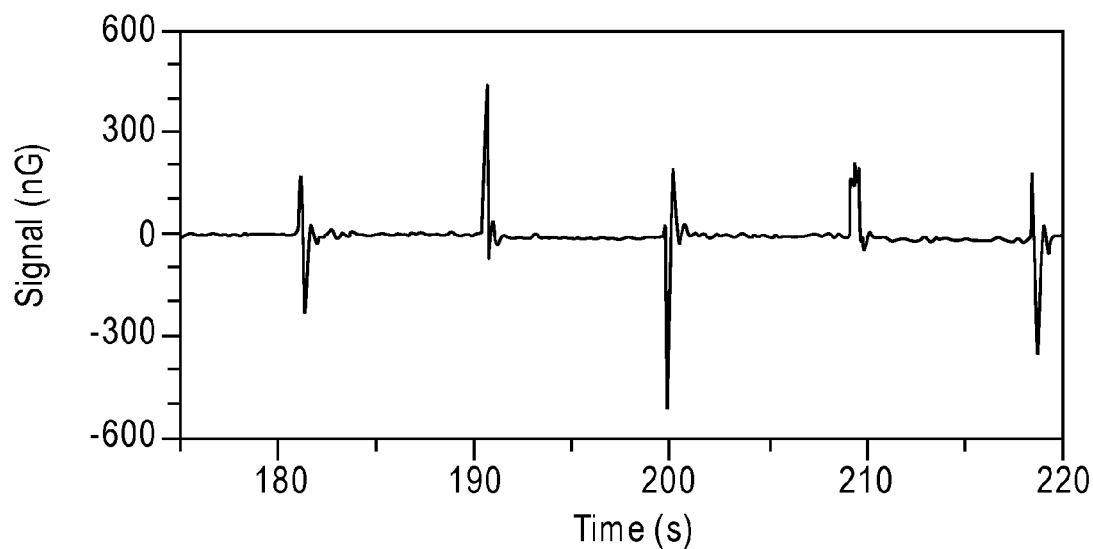
Figure 15B:
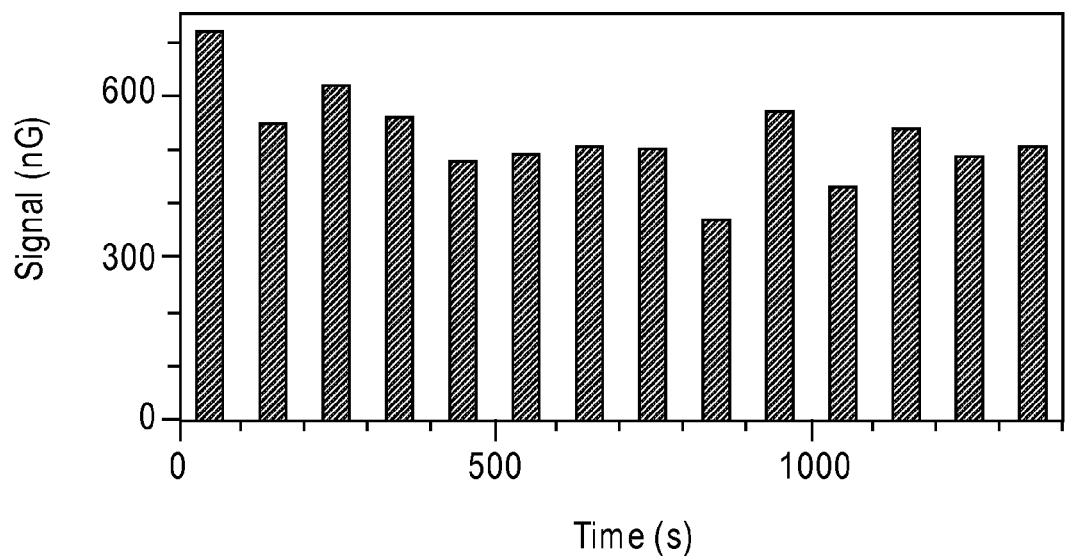

Results are shown in FIGS. 15A and 15B, with water flow rate 160 ml/min. FIG. 15A shows typical real time detection as the particles circulate. In order to measure the possible relaxation of the magnetization of the superparamagnetic particles, the signal for over 1400 seconds was continuously monitored. Averages of ten consecutive measurements are plotted versus the average measurement time after initial magnetization of the sample by a 3 kG permanent magnet (FIG. 15B). (Using a 20 kG field for magnetization made no substantial difference in the signal amplitude.) No significant decay was observed for the time span of the experiment. From the amplitude of the averaged signal, a detection limit of 0.2 nl, or 5×10$^3$ particles was estimated. The leading field was also varied between 0 and 0.5 G, which produced no observable change in the signal.

The other sample was a ferromagnetic fluid (Strem Chemicals, 27-0001) incorporating cobalt nanoparticles with diameter 10 nm. The sample was loaded in a similar fashion to the superparamagnetic particles mentioned above. The ferromagnetic fluid with cobalt nanoparticles produced strong signal because of their high magnetization (as shown in FIG. 16, with water flowing at 130 ml/min). From the average signal-to-noise ratio of 360, it was estimated that the smallest detectable amount would be 50 pl for the fluid tested, with a detection time constant of 30 ms.

These experiments suggest diverse applications for the method described here. The ability to detect rare events (single particles) in a large amount of sample could be used for security applications to screen for magnetically labeled viruses in dilute environments or for in-line quality control devices for industrial processes involving magnetic products or impurities (for example, detection of ferromagnetic particulates in engine oil). The methods described here also have potential applications in biological and medical research. The high sensitivity could allow detection of trace amounts of proteins, DNA, or antibodies that have been labeled by magnetic beads, and in the study of biochemical events associated with the aggregation of magnetic particles.

The detection limit could be improved significantly by further optimization and modification of the apparatus. For example, sensitivity can be improved by using additional sensor cells. A higher-order gradiometer can thus be formed, which could allow one to eliminate the need for magnetic shielding. Smaller alkali vapor cells[8], which can be put closer to the sample thus improve the sample filling factor, will also be investigated. This will enhance the detection limit, allowing the method to be coupled with microfluidic applications.

REFERENCES

The following references are referred to in the text of the specification above:
1. C. Cohen-Tannoudji, J. DuPont-Roc, S. Haroche, and F. Lalo, Phys. Rev. Lett. 22, 758 (1969).
2. N. R. Newbury, A. S. Barton, P. Bogorad, G. D. Cates, M. Gatzke, H. Mabuchi, and B. Saam, Phys. Rev. A 48, 558 (1993).
3. J. C. Allred, R. N. Lyman, T. W. Kornack, and M. V. Romalis, Phys. Rev. Lett. 89, 130801 (2002).

4. I. K. Kominis, T. W. Kornack, J. C. Allred, and M. V. Romalis, Nature 422, 596 (2003).
5. D. Budker, V. Yashchuk, and M. Zolotorev, Phys. Rev. Lett. 81, 5788 (1998).
6. D. Budker, D. F. Kimball, S. M. Rochester, V. V. Yashchuk, and M. Zolotorev, Phys. Rev. A 62, 043403 (2000).
7. D. Budker, D. F. Kimball, V. V. Yashchuk, and M. Zolotorev, Phys. Rev. A 65, 055403 (2002).
8. M. V. Balabas, D. Budker, J. Kitching, P. D. D. Schwindt, and J. E. Stalnaker, J. Opt. Soc. Am. B 23, 1001 (2006).
9. W. Gawlik, L. Krzemien, S. Pustelny, D. Sangla, J. Zachorowski, M. Graf, A. O. Sushkov, and D. Budker, Nonlinear Magneto-Optical Rotation with Amplitude-Modulated Light: AMOR; physics/0510207 (accepted by Appl. Phys. Lett.).
10. M. H. Levitt, *Spin dynamics: basics of nuclear magnetic resonance* (Wiley & Sons, Chichester, 2001).
11. P. T. Callaghan, *Principles of nuclear magnetic resonance microscopy* (Clarendon, N.Y., 1991).
12. V. V. Yashchuk, J. Granwehr, D. F. Kimball, S. M. Rochester, A. H. Trabesinger, J. T. Urban, D. Budker, and A. Pines, Phys. Rev. Lett. 93, 160801 (2004).
13. I. M. Savukov and M. V. Romalis, Phys. Rev. Lett. 94, 123001 (2005).
14. R. McDemont, A. H. Trabesinger, M. Mück, E. L. Hahn, A. Pines, and J. Clarke, Science 295, 2247 (2002).
15. A. Wong-Foy, S. Saxena, A. J. Moulé, H.-M. L. Bitter, J. A. Seeley, R. McDermott, J. Clarke, and A. Pines, J. Magn. Reson. 157, 235 (2002).
16. S. K. Lee, M. Mößle, W. Myers, N. Kelso, A. H. Trabesinger, A. Pines, and J. Clarke, Magn. Reson. Med. 53, 9 (2005).
17. A. J. Moulé, M. M. Spence, S.-I. Han, J. A. Seeley, K. L. Pierce, S. Saxena, and A. Pines, Proc. Natl. Acad. Sci. USA 100, 9122 (2003).
18. J. A. Seeley, S.-I. Han, and A. Pines, J. Magn. Reson. 167, 282 (2004).
19. J. Granwehr, E. Harel, S. Han, S. Garcia, A. Pines, P. N. Sen, and Y. Q. Song, Phys. Rev. Lett. 95, 075503 (2005).
20. B. M. Goodson, J. Magn. Reson. 155, 157 (2002).
21. S. Xu, V. V. Yashchuk, M. H. Donaldson, S. M. Rochester, D. Budker, and A. Pines, Magnetic resonance imaging with an optical atomic magnetometer, submitted to Proc. Natl. Acad. Sci. USA. 103, 12668 (2006).
22. E. B. Alexandrov, M. V. Balabas, D. Budker, D. English, D. F. Kimball, C. H. Li, and V. V. Yashchuk, Phys. Rev. A 66, 042903/1 (2002).
23. V. V. Yashchuk, D. Budker, and J. R. Davis, Rev. Sci. Instr. 71, 341 (2000).
24. K. L. Corwin, Z.-T. Lu, C. F. Hand, R. J. Epstain, and C. E. Wieman, Appl. Opt. 37, 3295 (1998).
25. D. Budker, D. J. Orlando, and V. V. Yashchuk, Am. J. Phys. 67, 584 (1999).
26. Q. A. Pankhurst, J. Connolly, S. K. Jones, and J. Dobson, J. Phys. D: Appl. Phys. 36, R167 (2003).
27. J.-M. Nam, C. S. Thaxton, and C. A. Mirkin, Science 301, 1884 (2003).
28. J. Connolly, T. G. St Pierre, M. Rutnakornpituk, and J. S. Riffle, J. Phys. D: Appl. Phys. 37, 2475 (2004).
29. A. K. Gupta and M. Gupta, Biomaterials 26, 3995 (2005).
30. S. Odenbach, J. Phys.: Condens. Matter 15, S1497 (2003).
31. A. Tsukamoto, K. Saitoh, D. Suzuki, N. Sugita, Y. Seki, A. Kandori, K. Tsukada, Y. Sugiura, S. Hamaoka, H. Kuma, N. Hamasaki, and K. Enpuku, IEEE Trans. Appl. Superconduc. 15, 656 (2005).
32. H.-J. Krause, G. I. Panaitov, N. Wolters, D. Lomparski, W. Zander, Y. Zhang, E. Oberdoerffer, D. Wollersheim, and W. Wilke, IEEE Trans. Appl. Superconduc. 15, 729 (2005).
33. D. K. Wood, K. K. Ni, D. R. Schmidt, and A. N. Cleland, Sensors and Actuators A 120, 1 (2005).
34. N. Pekas, M. D. Porter, M. Tondra, A. Popple, and A. Jander, Appl. Phys. Lett. 85, 4783 (2004).
35. S. M. Montemayor, L. A. García-Cerda, and J. R. Torres-Lubián, Materials Letters 59, 1056 (2005).
36. P. C. Fannin, A. Slawska-Waniewska, P. Didukh, A. T. Giannitsis, and S. W. Charles, Eur. Phys. J. AP 17, 3 (2002).
37. C. Affolderbach, M. Stähler, S. Knappe, and R. Wynands, Appl. Phys. B 75, 605 (2002).
38. S. E. Turvey, E. Swart, M. C. Denis, U. Mahmood, C. Benoist, R. Weissleder, and D. Mathis, J. Clin. Invest. 115, 2454 (2005).
39. I. K. Kominis, T. W. Kornack, J. C. Allred, and M. V. Romalis, Nature 422, 596 (2003).
40. S. Xu, S. M. Rochester, V. V. Yashchuk, M. H. Donaldson, and D. Budker, Rev. Sci. Instrum. 77, 083106 (2006).

Conclusion

All publications, patents, and patent applications mentioned in this specification are herein incorporated by reference to the same extent as if each individual publication or patent application were each specifically and individually indicated to be incorporated by reference.

The description given here, and best modes of operation of the invention, are not intended to limit the scope of the invention. Many modifications, alternative constructions, and equivalents may be employed without departing from the scope and spirit of the invention.

The invention claimed is:

1. A method of nuclear magnetic resonance comprising the steps of:
   a) prepolarizing an analyte;
   b) encoding the analyte in a sample outside of a laser-based atomic magnetometer apparatus;
   c) detecting the polarization of the analyte with the laser-based atomic magnetometer apparatus comprising:
      i) one or more polarization detector cells to detect magnetic fields;
      ii) a laser source optically coupled to the polarization detector cells;
      iii) a detector that measures the laser source after being coupled to the polarization detector cells; and
   d) forming a nuclear magnetic resonance image from a data set acquired from the detecting step, wherein detecting the polarization of the analyte with the laser-based atomic magnetometer apparatus comprises flowing the sample comprising the encoded analyte between two polarization detector cells.

2. The method of nuclear magnetic resonance of claim 1 comprising:
   a) passing the prepolarized analyte into the sample.

3. The method of nuclear magnetic resonance of claim 1 wherein
   a) the prepolarized analyte is already present in the sample.

4. The method of nuclear magnetic resonance of claim 1 wherein
   a) the encoding step encodes spatial information.

5. The method of nuclear magnetic resonance of claim 1 wherein
 a) the encoding step encodes spectroscopic information.

6. The method of claim 1, wherein the one or more polarization detector cells are cubic.

7. A method for nuclear magnetic resonance (NMR) of a sample, comprising:
 a) prepolarizing nuclear spins in the sample in an inhomogeneous millitesla or higher magnetic field;
 b) detecting nuclear magnetic resonance (NMR) signals from the sample with a laser-based atomic magnetometer to form detected NMR signals.

8. The method of claim 7 wherein the prepolarizing magnetic field is in the range of about 1 mT to about 0.5 T.

9. The method of claim 7 wherein the prepolarizing step comprises one or more of the group consisting of:
 a) exposing the sample to a mT or stronger magnetic field;
 b) hyperpolarizing one or more of the group consisting of $^{129}$Xe, $^{131}$Xe, $^{3}$He, and parahydrogen;
 c) dynamically polarizing; and
 d) chemical nuclear polarizing.

10. The method of claim 7 wherein the detecting step is performed with one or more alkali cells.

11. The method of claim 10 wherein:
 a) the sample is maintained substantially at room temperature; and
 b) the alkali cells are maintained in a temperature range from room temperature to 250° C.

12. The method of claim 7 wherein the detecting step is performed with one or more polarization detectors.

13. The method of claim 12 further comprising:
 a) performing magnetoencephalography.

14. The method of claim 7 wherein the prepolarization is performed by resonant spin manipulation.

15. The method of claim 7 wherein the prepolarization is performed by nonresonant spin manipulation.

16. The method of claim 7 wherein the detection magnetic field is substantially inhomogeneous.

17. The method of claim 7 further comprising performing magnetic resonance imaging (MRI) of the sample by forming an image from the detected NMR signals.

18. The method of claim 17 further comprising applying encoding magnetic field gradients to the sample to encode spatial information.

19. The method of claim 7 comprising simultaneously detecting multinuclear species.

20. The method of claim 7 further comprising obtaining scalar ("J") coupling information from the detected NMR signals.

21. The method of claim 7, comprising encoding the nuclear spins outside of the laser-based atomic magnetometer.

22. The method of claim 7, wherein detecting NMR signals with the laser-based atomic magnetometer comprises flowing the sample between two polarization detector cells.

23. The method of claim 7, wherein detecting NMR signals with the laser-based atomic magnetometer comprises flowing the sample through a solenoid that pierces a magnetic shield around the laser-based atomic magnetometer.

24. The method of claim 23, wherein the piercing solenoid is positioned between two polarization detector cells.

25. The method of claim 7, wherein the laser-based atomic magnetometer comprises one or more cubic polarization detector cells.

26. A method of nuclear magnetic resonance comprising the steps of:
 a) prepolarizing an analyte;
 b) encoding the analyte in a sample outside of a laser-based atomic magnetometer apparatus;
 c) detecting the polarization of the analyte with the laser-based atomic magnetometer apparatus comprising:
  i) one or more polarization detector cells to detect magnetic fields;
  ii) a laser source optically coupled to the polarization detector cells;
  iii) a detector that measures the laser source after being coupled to the polarization detector cells; and
 d) forming a nuclear magnetic resonance image from a data set acquired from the detecting step, wherein detecting the polarization of the analyte with the laser-based atomic magnetometer apparatus comprises flowing the sample comprising the encoded analyte through a solenoid that pierces a magnetic shield around the laser-based atomic magnetometer apparatus.

27. The method of claim 26, wherein the piercing solenoid is positioned between two polarization detector cells.

28. The method of nuclear magnetic resonance of claim 26, comprising passing the prepolarized analyte into the sample.

29. The method of nuclear magnetic resonance of claim 26, wherein the prepolarized analyte is already present in the sample.

30. The method of nuclear magnetic resonance of claim 26, wherein the encoding step encodes spatial information.

31. The method of nuclear magnetic resonance of claim 26, wherein the encoding step encodes spectroscopic information.

32. The method of claim 26, wherein the one or more polarization detector cells are cubic.

* * * * *